(12) United States Patent
Asako et al.

(10) Patent No.: US 11,456,184 B2
(45) Date of Patent: Sep. 27, 2022

(54) SUBSTRATE PROCESSING METHOD AND SUBSTRATE PROCESSING SYSTEM

(71) Applicant: Tokyo Electron Limited, Tokyo (JP)

(72) Inventors: Ryuichi Asako, Miyagi (JP); Tatsuya Yamaguchi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/078,275

(22) Filed: Oct. 23, 2020

(65) Prior Publication Data
US 2021/0125837 A1 Apr. 29, 2021

(30) Foreign Application Priority Data
Oct. 28, 2019 (JP) .............................. JP2019-195652

(51) Int. Cl.
*H01L 21/311* (2006.01)
*B05D 1/00* (2006.01)
*C23C 16/52* (2006.01)
*C23C 16/04* (2006.01)
*C23C 16/02* (2006.01)

(52) U.S. Cl.
CPC .......... *H01L 21/31144* (2013.01); *B05D 1/60* (2013.01); *C23C 16/0236* (2013.01); *C23C 16/047* (2013.01); *C23C 16/52* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 9,911,595 | B1* | 3/2018 | Smith | H01L 21/02211 |
| 2012/0244677 | A1* | 9/2012 | Lin | B81C 1/00269 |
| | | | | 438/455 |
| 2014/0199550 | A1* | 7/2014 | Helvajian | C23C 16/4415 |
| | | | | 428/428 |
| 2016/0181116 | A1* | 6/2016 | Berry, III | H01L 21/67069 |
| | | | | 438/715 |
| 2017/0323781 | A1* | 11/2017 | Kachian | C23C 16/56 |
| 2018/0269069 | A1* | 9/2018 | Yamaguchi | H01L 21/3086 |
| 2019/0323124 | A1* | 10/2019 | Yamaguchi | C23C 16/45578 |
| 2020/0211857 | A1* | 7/2020 | Asako | B05D 1/60 |
| 2021/0087691 | A1* | 3/2021 | Azumo | C23C 16/56 |

FOREIGN PATENT DOCUMENTS

JP 2018-164079 10/2018

* cited by examiner

Primary Examiner — Allan W. Olsen
(74) Attorney, Agent, or Firm — IPUSA, PLLC

(57) ABSTRACT

A method is provided. In the method, a substrate having a first region and a second region on a substrate surface is provided. A film deposition material to form a first chemical bond in the first region and a second chemical bond in the second region is supplied to the substrate surface. The second bond has a second bond energy lower than a first bond energy of the first chemical bond. A film is selectively formed in the first region by supplying an energy lower than the first bond energy of the first chemical bond and higher than the second bond energy of the second chemical bond.

8 Claims, 16 Drawing Sheets

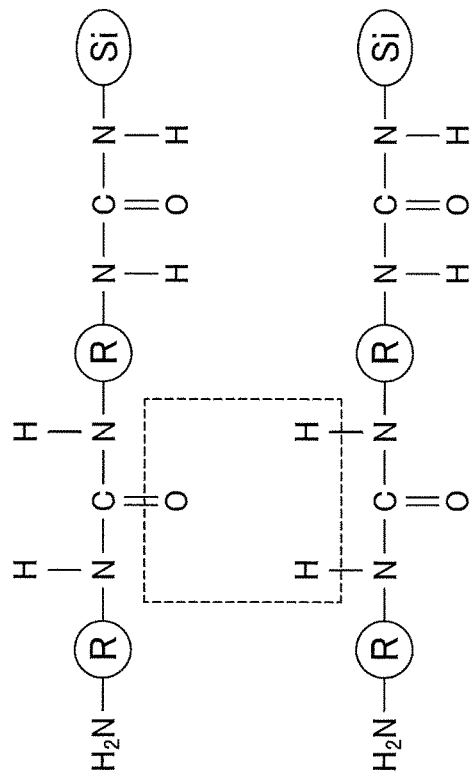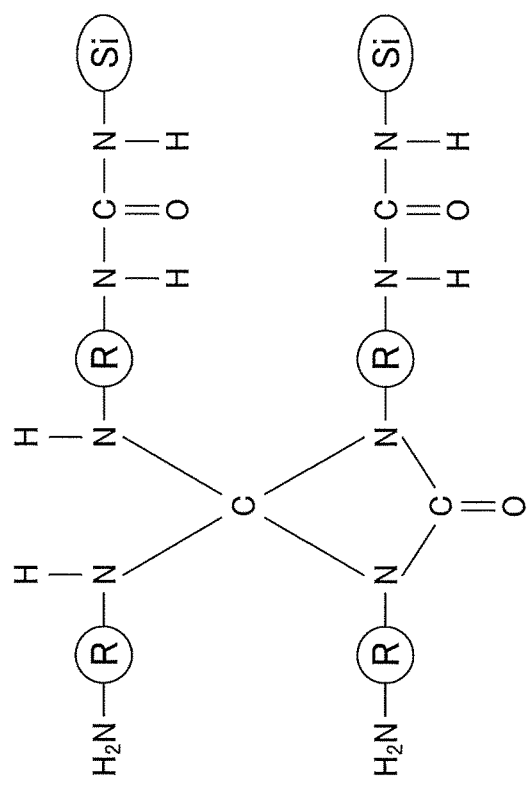
FIG.14

SUBSTRATE PROCESSING METHOD AND SUBSTRATE PROCESSING SYSTEM

CROSS-REFERENCE TO RELATED APPLICATION

The present application is based on and claims priority to Japanese Priority Application No. 2019-195652 filed on Oct. 28, 2019, the entire contents of which are hereby incorporated herein by reference.

BACKGROUND

1. Technical Field

The present disclosure relates to a substrate processing method and a substrate processing system.

2. Description of the Related Art

In the manufacture of semiconductor devices, there are techniques for selectively depositing a polymeric film on a substrate. For example, Japanese Patent Application Laid-Open No. 2018-164079 discloses a method of exposing a substrate to an alkene that selectively reacts with a silicon surface to block a silicon surface by forming an organic moiety on the silicon surface.

SUMMARY

The present disclosure provides a substrate processing method and a substrate processing system that can perform a selective film deposition process.

According to one embodiment of the present disclosure, there is provided a method. In the method, a substrate having a first region and a second region on a substrate surface is provided. A film deposition material to form a first chemical bond in the first region and a second chemical bond in the second region is supplied to the substrate surface. The second bond has a second bond energy lower than a first bond energy of the first chemical bond. A film is selectively formed in the first region by supplying an energy lower than the first bond energy of the first chemical bond and higher than the second bond energy of the second chemical bond.

BRIEF DESCRIPTION OF THE DRAWINGS

FIG. 14 is a diagram illustrating a chemical formula in which a first chemical bond (urea bond) forms a crosslinked structure;

DETAILED DESCRIPTION

Figure 1:
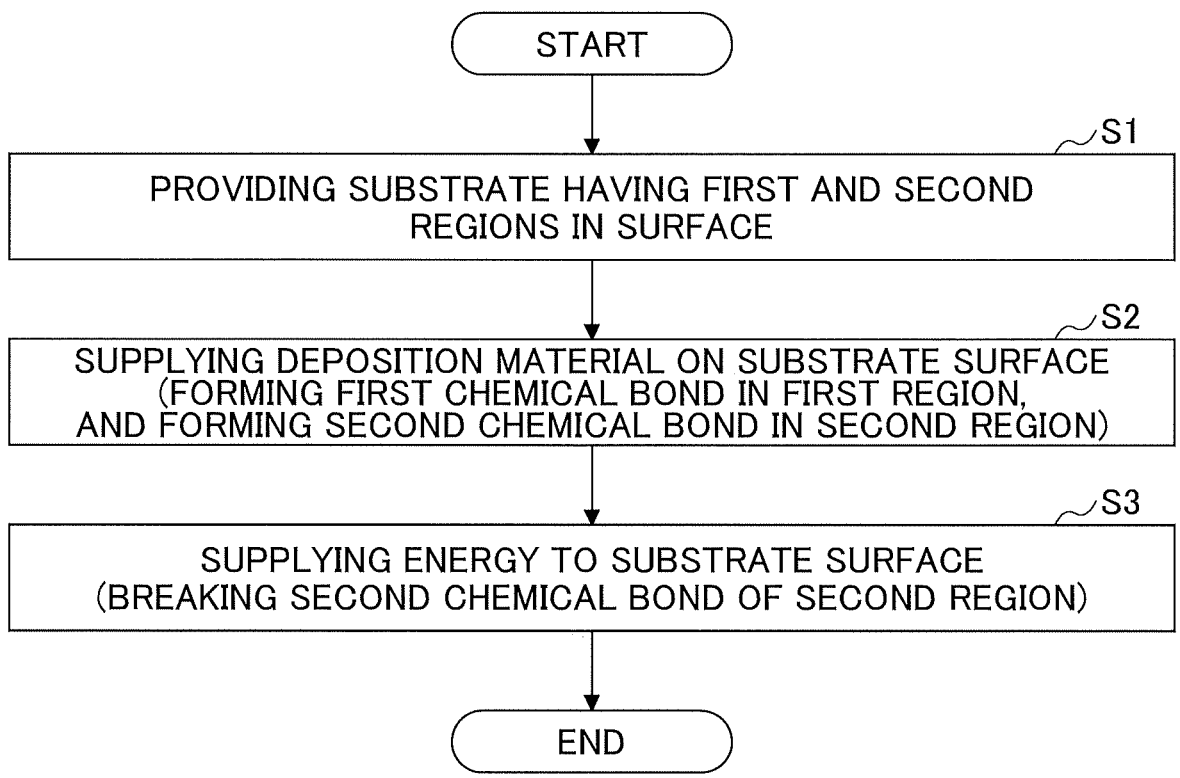
FIG. 1 is a flowchart illustrating a first embodiment of a substrate processing method according to the present disclosure.

Hereinafter, embodiments of the present disclosure will be described in detail with reference to the drawings. In some cases, the description of the parts that are common to each drawing is omitted with the same reference numerals.

<Substrate Processing Method>

Figure 2:
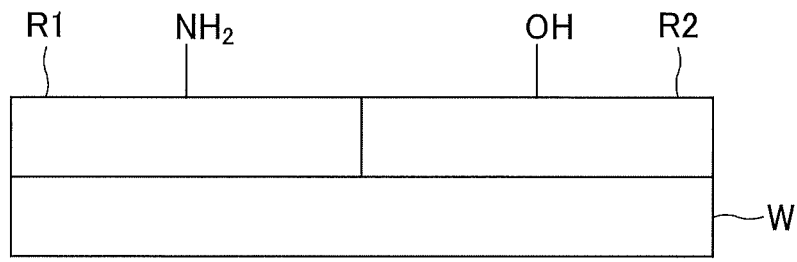
FIG. 2 is an image diagram of a substrate having a first region and a second region before a film deposition material is supplied according to a first embodiment.
Figure 3:
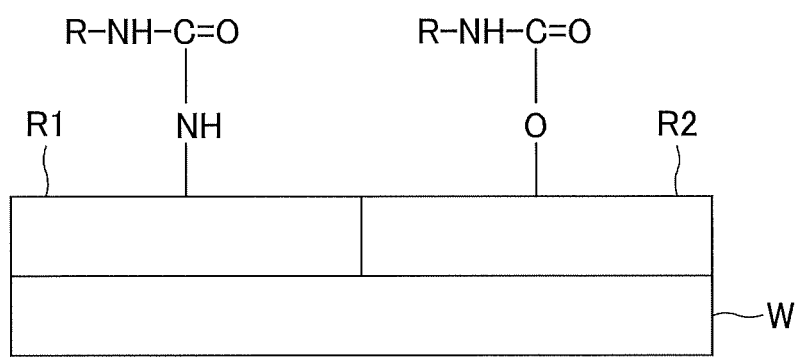
FIG. 3 is an image diagram of a substrate having a first region and a second region after a deposition material is supplied according to a first embodiment.
Figure 4:
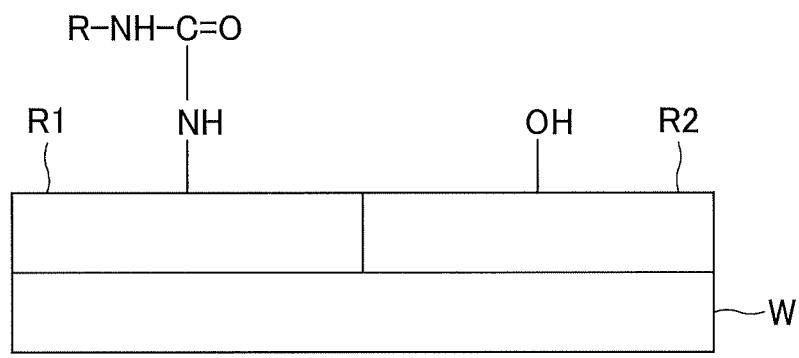
FIG. 4 is an image diagram of a substrate having a first region and a second region after a temperature is adjusted according to a first embodiment.

FIG. 1 is a flowchart illustrating a first embodiment of a substrate processing method according to the present disclosure. FIGS. 2 to 4 are images of a substrate having a first region and a second region from before a film deposition material is supplied to when a temperature is adjusted after a film deposition material is supplied according to a first embodiment.

The substrate processing method of the first embodiment includes steps of: a) providing a substrate having a first region and a second region on a surface; b) supplying to the substrate surface a film deposition material forming a first chemical bond in the first region and a second chemical bond in the second region having a lower binding energy than the first chemical bond; and c) selectively forming a film in the first region by supplying to the substrate surface an energy lower than the binding energy of the first chemical bond and higher than the binding energy of the second chemical bond. Specifically, Steps S1 through S3 are performed as shown in FIG. 1.

In the substrate processing method according to the first embodiment, in step S1, a substrate to be processed (hereinafter, simply referred to as a substrate) having a first region and a second region on the surface is provided. The substrate to be processed may be comprised of a semiconductor wafer (hereinafter, referred to as a wafer) for which substrate processing is performed and a device or interconnection pattern is formed on the surface thereof. The substrate to be processed is not limited to such a wafer, and may be comprised of a glass substrate for manufacturing a flat panel display. As used herein, the substrate to be processed is an example of a substrate provided in the substrate processing method of the present disclosure.

The substrate to be processed has a first region R1 and a second region R2 on the surface. The first region R1 and the second region R2 represent regions arranged in a plane viewed from above the substrate, for example. The regions arranged in a plane may be arranged in the same plane or may be arranged in different planes having steps in the thickness direction of the substrate. Step S1 is an example of the step of providing a substrate in the substrate processing method of the present disclosure.

The configurations of the first region R1 and the second region R2 are not particularly limited, but the structure is preferably capable of forming a chemical bond with the film deposition material to be described later. The chemical bond refers to a bond between atoms when atoms or ions are joined together to form a molecular or a crystal. In the present disclosure, for example, the first region R1 is formed of silicon nitride ($Si_3N_4$) and the second region R2 is formed of silicon oxide ($SiO_2$). That is, the present disclosure provides a wafer W having a SiN region and a $SiO_2$ region on the surface (see step S1 of FIG. 1).

Incidentally, the surface (terminal) of the first region R1 formed of silicon nitride is likely to cause hydrogen (H) to bond to the excessive bonding hand. Specifically, as shown in FIG. 2, the surface of the first region R1 is composed of a Si—$NH_2$ group. In addition, the surface (terminal) of the second region R2 formed of silicon oxide is likely to cause a hydroxyl group (OH group) to bond to the excessive binding hand. Specifically, the surface of the second region R2 is composed of a Si—OH group (see FIG. 2).

In this disclosure, the surface temperature of the substrate (wafer W) provided in step S1 is adjusted. The surface temperature of the wafer W to be adjusted is not particularly limited, but is preferably a temperature such that a chemical bond can be formed in the first region R1 and the second region R2 by reaction with the film deposition material. The surface temperature of the wafer W to be adjusted is further preferably a temperature such that any of the chemical bond formed in the first region R1 and the second region R2 is not cleaved.

In this disclosure, when the first region R1 (silicon nitride) and the second region R2 (silicon oxide) react with the film deposition material (isocyanate) described below, the temperature is adjusted so that a first chemical bond (urea bond) is formed in the first region R1 and that a second chemical bond (urethane bond) is formed in the second region R2. For example, the surface temperature of the wafer W may be adjusted to about 40 degrees C. to 100 degrees C.

In step S2, the film deposition material is supplied to the substrate (wafer W) surface. The film deposition material forms a first chemical bond in the first region R1, and a second chemical bond in the second region R2 with a lower binding energy than the first chemical bond. Step S2 is an example of a step of supplying a film deposition material to a substrate surface in the substrate processing method of the present disclosure.

The form of the chemical bond is preferably a covalent bond, but may also contain a mixture of covalent and non-covalent chemical bonds (e.g., ionic bonds). In addition, a portion of the film deposition material may be covalently bonded to the first region R1 and the second region R2, while another portion may be physisorbed (hereinafter, referred to as "adsorption") by intermolecular force or the like. The bond energy also represents the energy required to break a bond between atoms, or the energy released when separated atoms bond with each other.

The configurations of the first chemical bond and the second chemical bond are not particularly limited. However, from the viewpoint of the bond energy of the second chemical bond being lower than that of the first chemical bond, the first chemical bond is preferably a urea bond and the second chemical bond is preferably a urethane bond.

Both urea and urethane bonds contain a carbonyl group and are energetically stabilized by delocalization of electrons. However, because the electronegativity of the carbonyl group and an adjacent atom is greater when the adjacent atom is oxygen than when the adjacent atom is nitrogen, delocalization is less effective on urethane bonds containing esters than on amide-containing urea bonds. Thus, the bond energy of the urethane bond is less than that of the urea bond.

The composition of the coating material is not particularly limited. For example, when the first region R1 is formed of silicon nitride and the second region R2 is formed of silicon oxide, and when the urea bond is formed as the first chemical bond in the first region R1, and the urethane bond is formed as the second bond in the second region R2, the composition of the coating material is preferably a nitrogen-containing carbonyl compound.

Examples of nitrogen-containing carbonyl compounds include isocyanates. The isocyanate is a compound having a partial structure of —N=C=O. Incidentally, the isocyanate may have a plurality of partial structures having —N=C=O (for example, diisocyanate, etc.), or the isocyanate may be substituted with another substituent. Isocyanates include aromatic isocyanates and aliphatic isocyanates.

Examples of aromatic isocyanates include diisocyanatobenzene, diisocyanatotoluene, diphenylmethane diisocyanate, diisocyanatomecytylene, diisocyanatobiphenyl, diisocyanatobenzyl, bis(isocyanatophenyl)propane, bis(isocyanatophenyl)ether, bis(isocyanatophenoxyethane), diisocyanatoxylene, diisocyanatoanisole, diisocyanatophenetol, diisocyanatonaphthalene, diisocyanato-methylbenzene, diisocyanato-methylpyridine, diisocyanato-methylnaphthalene, and the like.

Examples of aliphatic isocyanates include aliphatic diisocyanates such as ethylene diisocyanate, diisocyanatoprophane, diisocyanatobutane, diisocyanatopentane, diisocyanatohexane, diisocyanatodecane; aliphatic triisocyanates such as triisocyanatohexane, triisocyanatononatonanate, and triisocyanatodecane; substituted cyclic aliphatic isocyanates such as diisocyanatocyclobutane, diisocyanatocyclohexane, 3-isocyanatomethyl-3,5,5-trimethylcyclohexyl isocyanate, methylene bis (cyclohexyl isocyanate), and the like.

In the present disclosure, an isocyanate is supplied to the wafer W surface. This creates a first chemical bond (urea bond) in the first region R1 (SiN region) of the wafer W surface and a second chemical bond (urethane bond) in the second region R2 (SiO2 region) (see Step S2 in FIG. 1 and FIG. 3).

Figure 5:
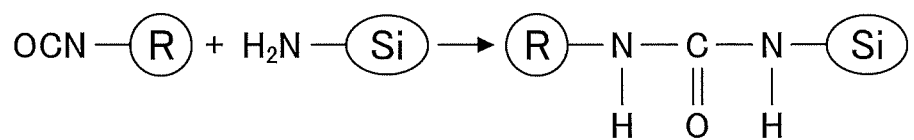
FIG. 5 is a diagram illustrating a reaction formula in which a first chemical bond (urea bond) is formed between a first region (silicon nitride) and a film deposition material (isocyanate)
Figure 6:
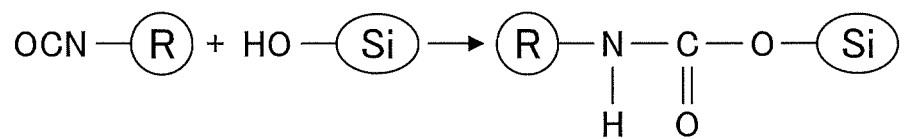
FIG. 6 is a diagram illustrating a reaction formula in which a second chemical bond (urethane bond) is formed from a second region (silicon oxide) and a film deposition material (isocyanate)

In the SiN region, a urea bond is formed by reaction of an amino group ($NH_2$ group) on the SiN region surface with an isocyanate (see FIG. 5). In the SiO2 region, the hydroxyl group (OH group) on the surface of the $SiO_2$ region reacts with the isocyanate to form a urethane bond (see FIG. 6). In the reaction formula shown in FIG. 5, Si is silicon on silicon nitride and R is any chemical structure. In the reaction formula shown in FIG. 6, Si is silicon on silicon oxide and R is any chemical structure.

In step S3, energy is supplied to the substrate (wafer W) surface. The supplied energy is lower than the bond energy of the first chemical bond and higher than the bond energy of the second chemical bond. In other words, this energy is lower than the dissociation energy of the first chemical bond and higher than the dissociation energy of the second chemical bond.

The dissociation energy refers to the energy released when a component composed of multiple elements is entirely or partially separated from the original component. Also, embodiments of the energy supplied may use a variety of energies including, but not limited to, thermal energy, electrical energy, vibratory energy, light energy, and the like.

The substrate processing method according to the present disclosure supplies the energy to the substrate surface in c) by adjusting the temperature of the substrate surface to a temperature lower than the temperature at which the first chemical bond is cleaved and equal to or higher than the temperature at which the second chemical bond is cleaved. Here, the temperature at which the first chemical bond is broken is equivalent to the bond energy (or dissociation energy) of the first chemical bond. The temperature at which the second chemical bond is broken is equivalent to the bond energy (or dissociation energy) of the second chemical bond.

In this disclosure, the first chemical bond (urea bond) formed in the first region R1 is not broken, but the second chemical bond (urethane bond) formed in the second region R2 is adjusted to a temperature at which the second chemical bond is broken. The urea bond pyrolyzes at a temperature exceeding 200° C. (about 230° C. to 300° C.), but does not pyrolyze at a temperature below 200° C. On the other hand, the urethane bond pyrolyzes at a temperature below 200° C. (170° C. to 200° C.). Therefore, in the present disclosure, the surface temperature of the wafer W is adjusted to about 200° C. Step S3 is an example of the step of supplying energy to the substrate surface in the substrate processing method of the present disclosure.

From step S3, the first chemical bond in the first region R1 is not cleaved and the second chemical bond in the second region R2 is cleaved. Specifically, the urea bond in the SiN region is not broken, but only the urethane bond in the $SiO_2$ region is broken. That is, the urethane bond in the $SiO_2$ region is removed by adjusting the surface temperature of the wafer W to about 200° C. (see step S3 in FIG. 1). Incidentally, by adjusting the surface temperature of the wafer W to about 200° C., unreacted isocyanates of the isocyanates supplied to the surface of the wafer W are also removed.

This leaves the first chemical bond formed in the first region R1 on the substrate surface. Specifically, the wafer W surface retains the urea bond formed in the SiN region (see FIG. 4).

A film such as a polymer can be formed in the first region R1 of the substrate surface by modifying the polymer and the like in advance in the film deposition material or by later modifying the polymer and the like to the first chemical bond formed in the first region R1. That is, the first chemical bond formed in the first region R1 can be a base for forming a film, such as a polymer, on the substrate surface (for example, a protective film for etching, and the like).

In the substrate processing method of the present disclosure, as described above, a film deposition material that forms a first chemical bond in the first region R1 and a second chemical bond in the second region R2 having a lower binding energy than the first chemical bond, are supplied to the substrate having the first region R1 and the second region R2 on the surface, and a higher energy than the binding energy of the second chemical bond is further supplied to the substrate having the first region R1 and the second region R2 on the surface.

This allows a film deposition material that reacts with both the first region R1 and the second region R2 to be selected. That is, it is possible to provide a substrate processing method that is not limited to the use of a film deposition material that reacts only to a portion (first region R1) on which a film is deposited. Therefore, according to the substrate processing method of the present disclosure, a selective film deposition process can be easily performed.

In addition, while the conventional selective film deposition process mainly consists of physical adsorption, the substrate processing method of the present disclosure includes a selective film deposition process mainly consisting of chemical adsorption. Therefore, according to the present disclosure, it is possible to provide a novel film deposition processing method.

Further, in the substrate processing method of the present disclosure, as described above, by adjusting the temperature of the substrate surface to a temperature lower than the temperature at which the first chemical bond is broken and higher than the temperature at which the second chemical bond is broken, it is possible to provide a substrate processing method with a high degree of accuracy that is not limited to the use of a film deposition material that reacts only to the portion of the substrate surface on which the film is deposited. Therefore, according to the substrate processing method according to the present disclosure, the selective film deposition process can be performed more easily.

Further, in the substrate processing method according to the present disclosure, because the first chemical bond formed in the first region R1 of the substrate surface remains, by forming the first region R1 with silicon nitride, and forming the second region R2 with silicon oxide, the silicon nitride of the first region R1 can be made the base of the film deposition process. Incidentally, in the conventional selective film deposition process, the base of the film deposition process is mainly composed of a hydroxyl group (OH group) of silicon oxide, whereas the substrate processing method of the present disclosure, as described above, is mainly composed of an amino group ($NH_2$ group) of silicon nitride, thereby increasing the bond strength of the base.

Further, in the substrate processing method of the present disclosure, it is easy to select a film deposition material in which the first chemical bond is constituted of a urea bond and the second chemical bond is constituted of a urea bond to form the first chemical bond in the first region R1 and the second chemical bond has a lower binding energy than the first chemical bond in the second region R2. Further, as the energy supplied to the substrate surface, it is easier to control the energy lower than the bond energy of the first chemical bond and higher than the bond energy of the second chemical bond.

Furthermore, in the substrate processing method of the present disclosure, by using a nitrogen-containing carbonyl compound as the film deposition material, it is easier to form a first chemical bond in the first region R1 and a second chemical bond in the second region R2, which has a lower bond energy than the first chemical bond. Also, it is easier to control energy below the bond energy of the first chemical bond and above the bond energy of the second chemical bond.

Figure 7:
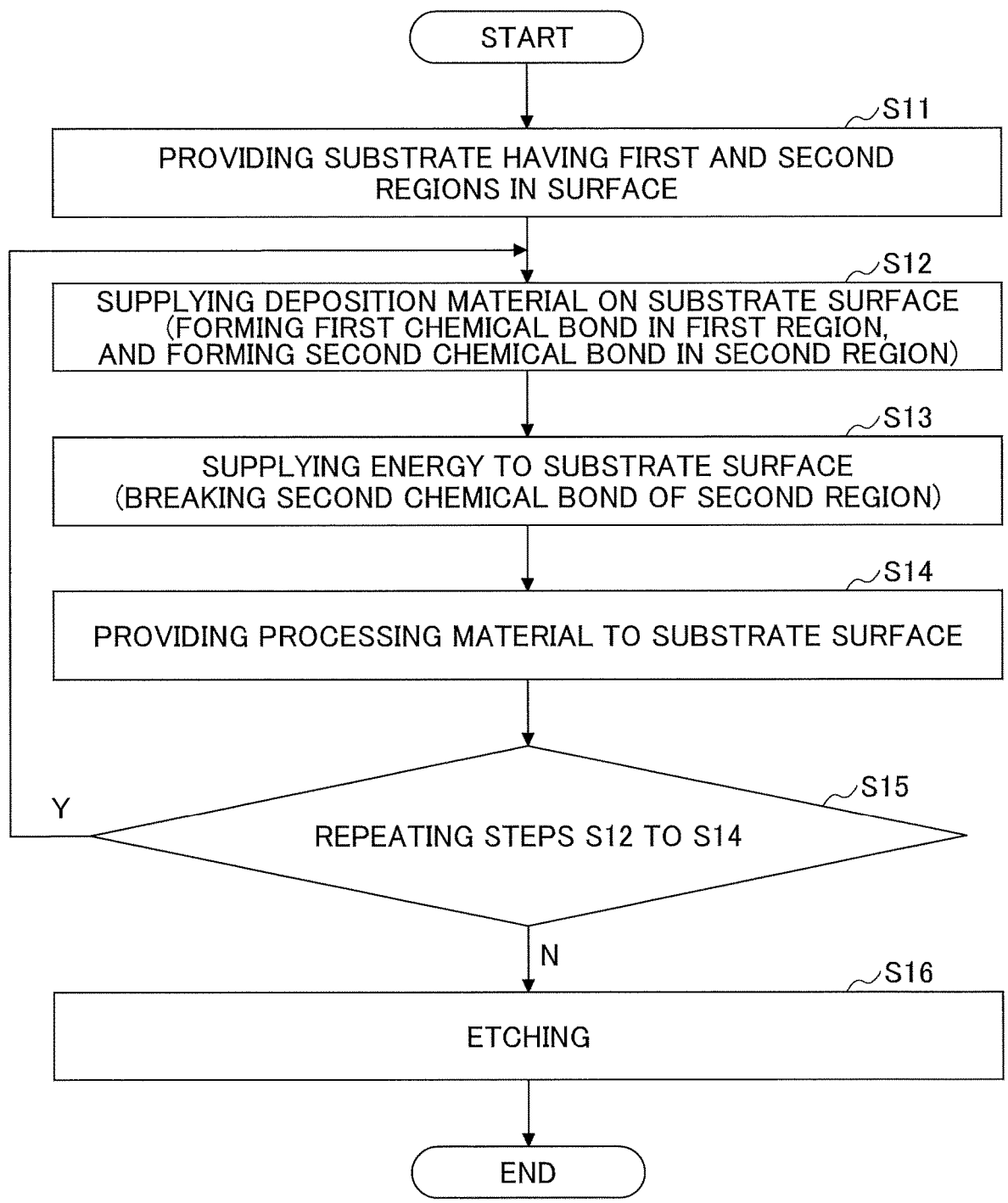
FIG. 7 is a flowchart illustrating a second embodiment of a substrate processing method according to the present disclosure.
Figure 8:
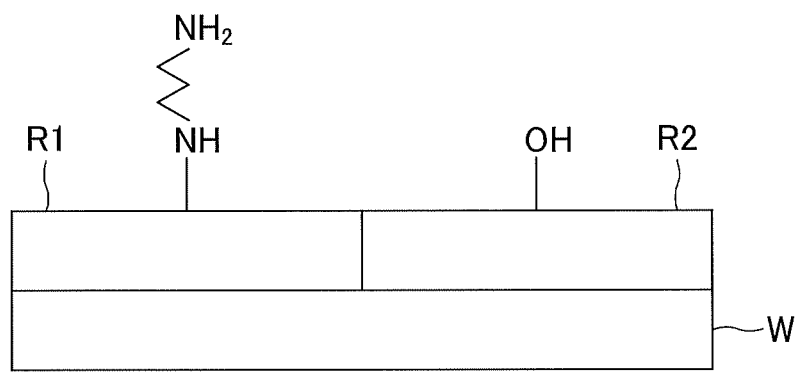
FIG. 8 is an image diagram of a substrate having a first region and a second region after a processing material is supplied according to a second embodiment.

FIG. 7 is a flowchart illustrating a second embodiment of a substrate processing method according to the present disclosure. FIG. 8 is an image diagram of a substrate having a first region and a second region after a processing material is supplied according to a second embodiment. Incidentally, in FIGS. 7 and 8, the part common to FIGS. 1 to 4 is described by adding the number of ten to the number of symbols given to FIGS. 1 to 4, and the description thereof is omitted.

The substrate processing method of the second embodiment includes d) supplying to the substrate surface, after c), a processing material that processes the terminal so that the first chemical bond is further formed at the terminal of the first chemical bond. Specifically, steps S11 to S16 of FIG. 7 are performed. In the substrate processing method according to the second embodiment, steps S11 to S13 are common to steps S1 to S3 of the substrate processing method according to the first embodiment.

In the substrate processing method according to the second embodiment, after the surface temperature of the substrate (wafer W) provided in step S11 is adjusted to about 100° C., diisocyanate is supplied to the surface of the wafer W. The urea bond is formed in the first region R1 (SiN region) of the wafer W surface, and the urethane bond is formed in the second region R2 ($SiO_2$ region).

Figure 9:
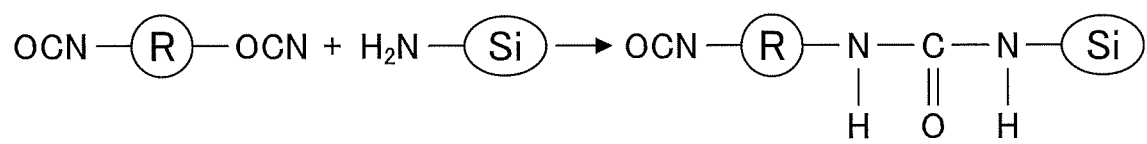
FIG. 9 is a diagram illustrating a reaction formula in which a first chemical bond (urea bond) is formed between a first region (silicon nitride) and a film deposition material (diisocyanate)

In the SiN region, the urea bond is formed by reaction of the amino group ($NH_2$ group) on the SiN region surface with the diisocyanate (see FIG. 9). In the $SiO_2$ region, the hydroxyl group (OH group) on the surface of the $SiO_2$ region reacts with the isocyanate to form a urethane bond (see FIG. 6). In the reaction formula shown in FIGS. 9 and 10 and in the structure shown in FIG. 11, Si is silicon on silicon nitride, R is any chemical structure, and n is two or more integers.

In the substrate processing method of the present disclosure, the surface temperature of the wafer W is adjusted after the surface temperature of the wafer W is adjusted to about 200° C., and the urethane bond in the $SiO_2$ region and the unreacted isocyanate are both removed.

The surface temperature of the wafer W to be adjusted is not particularly limited, but is preferably a temperature at which further chemical bonds can be formed in the first region R1 and the second region R2 by reaction with the film deposition material. The surface temperature of the wafer W to be adjusted is further preferably a temperature at which the first chemical bond formed in the first region R1 is not broken (a temperature lower than the temperature at which the first chemical bond is broken).

In the present disclosure, when a film deposition material (isocyanate) is reacted to a first region R1 (silicon nitride) and a second region R2 (silicon oxide), the temperature is adjusted so that a first chemical bond (urea bond) is formed in the first region R1 and a second chemical bond (urea bond) is formed in the second region R2. This temperature is a temperature at which the first chemical bond (urea bond) formed in the first region R1 (silicon nitride) is not broken (temperature lower than the temperature at which the urea bond is broken). Specifically, the surface temperature of the wafer W is adjusted to about 40° C. to 100° C.

In this disclosure, in step S14, a processing material is supplied to the substrate (wafer W) surface. The processing material is a material that processes the terminal such that a first chemical bond is further formed at the terminal of the first chemical bond. Step S14 is an example of the step of supplying the processing material to the substrate surface in the substrate processing method of the present disclosure.

Here, the terminal of the first chemical bond represents the portion of the first chemical bond formed in the first region R1 that corresponds to the binding (excess binding) that does not bind to the first region R1. Specifically, in the case where the first chemical bond is a urea bond, the isocyanate group (OCN group) forming the excess bond formed in the first region R1 (SiN region) of the wafer W surface corresponds to the terminal of the first chemical bond by supplying the diisocyanate to the wafer W surface in step S12 (see FIG. 9).

Incidentally, the processing material is not particularly limited, but from the viewpoint of the material that processes the terminal so that a first chemical bond is further formed at the terminal of the first chemical bond, for example, when the first chemical bond is a urea bond, it is preferable that the processing material causes the terminals of the first chemical bond to be terminated with the N terminal (an amino group or the like). Diamine is the preferred processing material. Diamines include, for example, alicyclic diamines, aromatic diamines, aromatic-aliphatic diamines, heterocyclic diamines, aliphatic diamines, urea-containing diamines.

Examples of alicyclic diamines include 1,4-diaminocyclohexane, 1,3-diaminocyclohexane, 4,4'-diaminodicyclohexylmethane, 4,4'-diamino-3,3'-dimethyldicyclohexylamine, isophorone diamine, and the like.

Examples of aromatic diamines include o-phenylenediamine, m-phenylenediamine, p-phenylenediamine, 2,4-diaminotoluene, 2,5-diaminotoluene, 3,5-diaminotoluene, 1,4-diamino-2-methoxybenzene, 2,5-diamino-p-xylene, 1,3-diamino-4-chlorobenzene, 3,5-diaminobenzoic acid, 1,4-diamino-2,5-dichlorobenzene, 4,4'-diamino-1,2-diphenylethane, 4,4'-diamino-2,2'-dimethylbibenzyl, 4,4'-diaminodiphenylmethane, 3,3'-diaminodiphenylmethane, 3,4'-diaminodiphenylmethane 4,4'-Diamino-3,3'-dimethyldiphenylmethane, 2,2'-diaminostylbene, 4,4'-diaminodiphenyl ether, 4,4'-diaminodiphenyl ether, 4,4'-diaminodiphenyl sulfide, 4,4'-diaminodidiphenylsulfone, 3,3'-diaminodiphenylsulfone, 4,4'-diaminobenzophenone, 1,3-bis(3-aminophenoxy)benzene, 1,3-bis(4-aminophenoxy)benzene, 1,4-bis(4-aminophenoxy)benzene, 3,5-bis(4-aminophenoxy) benzoic acid, 4,4'-bis(4-aminophenoxy)bibenzyl,2,2-Bis[(4-Aminophenoxy)methyl]propane, 2,2-bis[4-(4-aminophenoxy)phenyl]hexafluoropropane, 2,2-bis[4-(4-aminophenoxy)phenyl]propane, Bis[4-(3-aminophenoxy)phenyl]sulfone, bis[4-(4-aminophenoxy)phenyl]sulfone, 1,1-bis(4-aminophenyl)cyclohexane, α,α'-bis(4-aminophenyl)-1,4-diisopropylbenzene, 9,9-bis(4-aminophenyl)fluorene, 2,2-bis(3-aminophenyl)hexafluoropropane, 2,2-bis(4-aminophenyl)hexafluoropropane, 4,4'-diaminodiphenylamine, 2,4-diaminodiphenylamine, 1,8-diaminonaphthalene, 1,5-diaminonaphthalene, 1,5-diaminoanthraquinone, 1,3-diaminopyrene 1,6-Diaminopyrene, 1,8-Diaminopyrene, 2,7-Diaminofluorene, 1,3-bis(4-aminophenyl)tetramethyldisiloxane, Benzidine, 2,2'-dimethylbenzidine, 1,2-bis(4-aminophenyl)ethane, 1,3-bis(4-aminophenyl)propane, 1,4-bis(4-aminophenyl)butane, 1,5-bis(4-aminophenyl)pentane, 1,6-bis(4-aminophenyl) hexane, 1,7-bis(4-aminophenyl)heptane, 1,8-bis(4-aminophenyl)octane, 1,9-bis(4-aminophenyl)nonane, 1,10-bis(4-aminophenyl)decane, bis(4-aminophenoxy)methane, 1,2-bis(4-aminophenoxy)ethane, 1,3-bis(4-aminophenoxy)propane, 1,4-bis(4-aminophenoxy)butane, 1,5-bis(4-aminophenoxy)pentane 1,6-bis(4-aminophenoxy)hexane, 1,7-bis(4-aminophenoxy)heptane, 1,8-bis(4-aminophenoxy)octane, 1,9-bis(4-aminophenoxy)nonane, and 1,10-bis(4-aminophenoxy)decane, Di(4-Aminophenyl)propane-1,3-dioate, di(4-aminophenyl)butane-1,4-dioate, di(4-aminophenyl)pentan-1,5-dioate, di(4-aminophenyl)hexan-1,6-dioate, di(4-aminophenyl)heptan-1,7-dioate, di(4-aminophenyl)octane-1,8-dioate, di(4-aminophenyl)nonan-1,9-dioate, di(4-aminophenyl)decane-1,10-dioate, 1,3-bis[4-(4-aminophenoxy)phenoxy]propane, 1,4-bis[4-(4-aminophenoxy)phenoxy]butane,1,5-bis[4-(4-aminophenoxy)phenoxy]pentane, 1,6-bis[4-(4-aminophenoxy)phenoxy]hexane, 1,7-bis[4-(4-aminophenoxy)phenoxy]heptane, Examples include 1,8-bis[4-(4-aminophenoxy)phenoxy]octane, 1,9-bis[4-(4-aminophenoxy)phenoxy]nonane, 1,10-bis[4-(4-aminophenoxy)phenoxy]decane, and the like.

Examples of aromatic-aliphatic diamines are 3-aminobenzylamine, 4-aminobenzylamine, 3-amino-N-methylbenzylamine, 4-amino-N-methylbenzylamine, 3-aminophenetylamine, 4-aminophenethylamine, 3-amino-N-methylphenethylamine, 4-amino-N-methylphenethylamine, 3-(3-aminopropyl)aniline, 4-(3-aminopropyl)aniline, 3-(3-methylaminopropyl) aniline, 4-(3-methylaminopropyl)aniline, 3-(4-aminobutyl)aniline, 4-(4-aminobutyl)aniline, 3-(4-methylaminobutyl)aniline, 4-(4-methylaminobutyl) aniline, 4-(4-methylaminobutyl)aniline,3-(5-Aminopentyl) aniline, 4-(5-aminopentyl)aniline, 3-(5-methylaminopentyl) aniline, Examples include 2-(6-aminonaphthyl)methylamine, 3-(6-aminonaphthyl)methylamine, 2-(6-aminonaphthyl)ethylamine, 3-(6-aminonaphthyl)ethylamine, and the like.

Examples of heterocyclic diamines include 2,6-diaminopyridine, 2,4-diaminopyridine, 2,4-diamino-1,3,5-triazine, 2,7-diaminodibenzofuran, 3,6-diaminocarbazole, 2,4-diamino-6-isopropyl-1,3,5-triazine, 2,5-bis(4-aminophenyl)-1,3,4-oxadiazole, and the like.

Examples of aliphatic diamines are 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminonane, 1,10-diaminodecan, 1,3-diamino-2,2-dimethylpropane, 1,6-diamino-2,5-dimethylhexane, 1,7-diamino-2,5-dimethylheptane, 1,7-diamino-4,4-dimethylheptane, 1,7-diamino-3-methylheptane, 1,9-diamino-5-methylnonane, 1,12-diaminododecan, 1,18-diaminooctadecane Examples include 1,2-bis(3-aminopropoxy) ethane.

Examples of urea bond-containing diamines include N,N'-bis(4-aminophenethyl)urea and the like.

In the substrate processing method of the present disclosure, the terminal is processed such that the first chemical bond is further formed at the terminal of the first chemical bond by supplying such processing material to the substrate surface. Specifically, by supplying a diamine to the wafer W surface, the terminal of the urea bond formed in the SiN region becomes the N-terminal (amino group) (see FIG. 8). In other words, the amino group of the diamine reacts with the isocyanate group at the terminal of the urea bond formed in the SiN region, thereby forming a dimer in the SiN region using the urea bond as a monomeric unit (see FIG. 10).

By repeating steps S12 to S14, the first chemical bond is formed at the terminal of the first chemical bond. When Step S12 to Step S14 are repeated, the process is returned to Step S12 and Step S12 to Step S14 are executed again (see Step S15). Thus, by repeatedly forming the first chemical bond at the terminal of the first chemical bond, a polymer film composed of a polyurea is formed in the first region R1, and a polymer film is not formed in the second region R2 (see FIG. 11). Such polyureas may form a film selectively formed in the first region R1.

The substrate processing method of the present disclosure includes f) etching the second region selectively with respect to the first region by the film. As described above, the polyurea film selectively formed in the first region R1 has excellent heat resistance, chemical resistance, mechanical strength, and the like. Therefore, by supplying etching gas to the wafer surface on which polyurea is formed in the first region R1, the silicon nitride in the first region R1 is protected, and only the silicon oxide in the second region R2 is etched (see step S16 in FIG. 7).

According to the substrate processing method of the present disclosure, a base for selectively depositing polyurea can be formed in a first region R1 (silicon nitride) of the wafer W surface by supplying a processing material to the substrate surface for processing the terminal so that the first chemical bond is further formed at the terminal of the first chemical bond after the step of supplying energy to the substrate surface. In addition, the polyurea formed in the first region R1 (silicon nitride) of the wafer W surface can be used as a protective film for etching, which is selectively deposited on the substrate surface in a manufacturing process of a semiconductor device and the like.

Further, according to the substrate processing method of the present disclosure, by using diamine as processing material, it is easier to form a substrate for selectively forming polyurea in the first region R1 (silicon nitride) of the wafer W surface.

Figure 12:
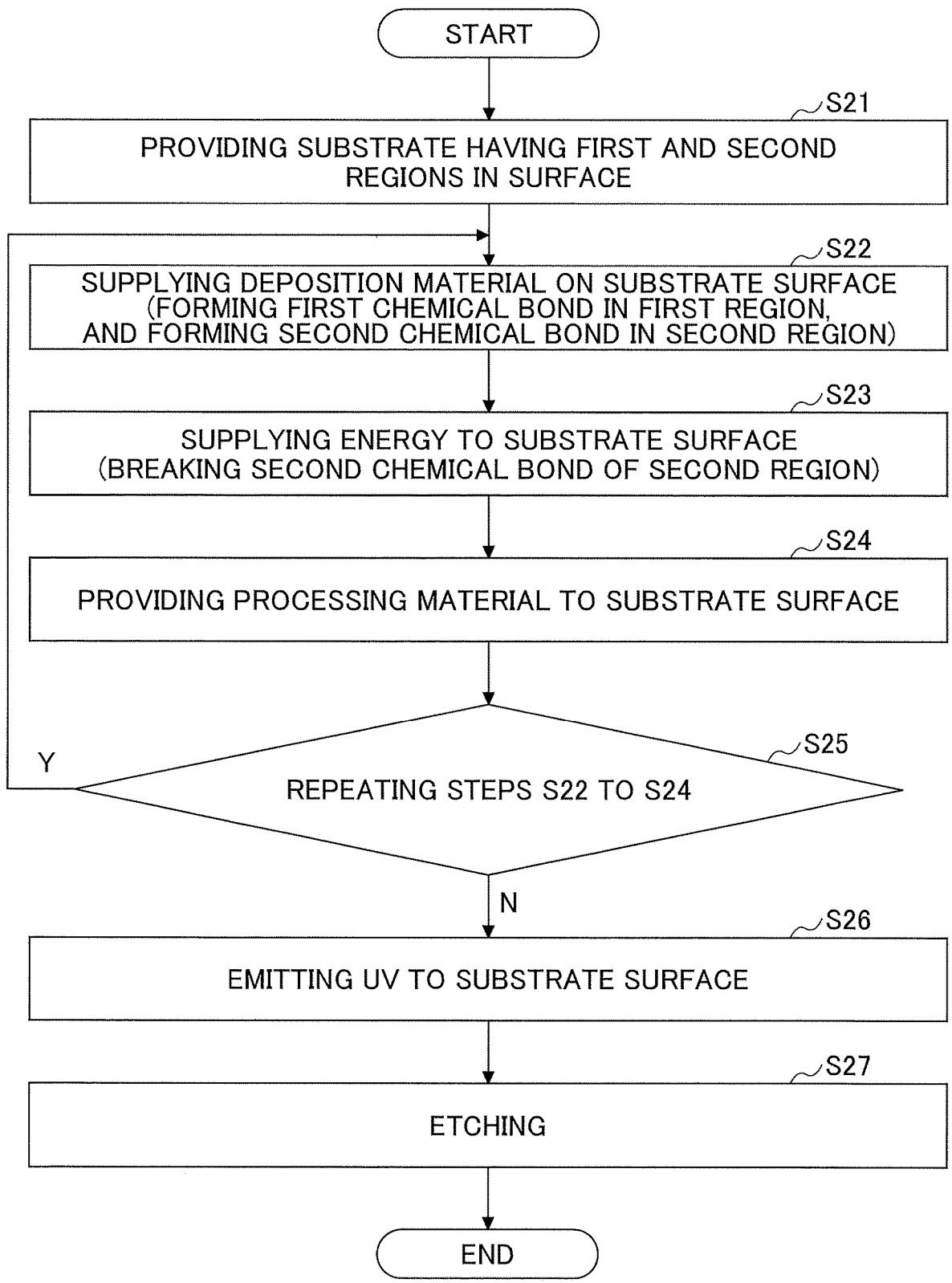
FIG. 12 is a flowchart illustrating a third embodiment of a substrate processing method according to the present disclosure.
Figure 13:
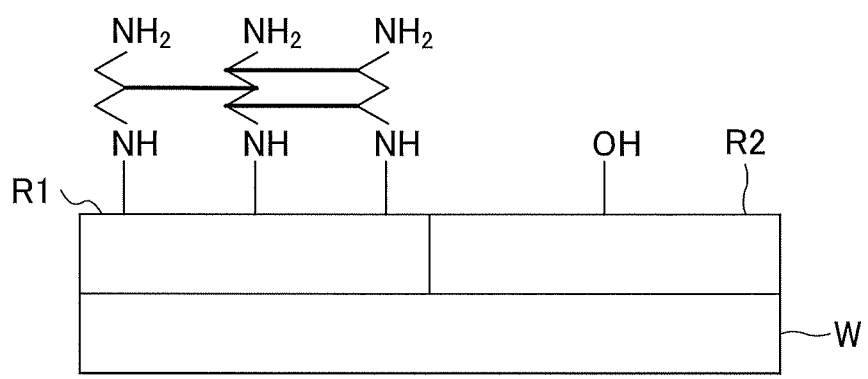
FIG. 13 is an image of a substrate having a first region and a second region after irradiating a surface of a substrate with ultraviolet light according to a third embodiment.

FIG. 12 is a flowchart illustrating a third embodiment of a substrate processing method according to the present disclosure. FIG. 13 is an image diagram of a substrate having a first region R1 and a second region R2 after irradiating the surface of the substrate with ultraviolet light according to a third embodiment.

The substrate processing method of the third embodiment includes e) irradiating the substrate surface with ultraviolet light after d). Specifically, Steps S21 to S27 of FIG. 12 are performed. In the substrate processing method according to the third embodiment, Steps S21 to S25 are common to Steps S11 to S15 of the substrate processing method according to the second embodiment.

In the substrate processing method according to the third embodiment, ultraviolet light (hereafter abbreviated as UV) is emitted to the wafer W surface on which polyurea is formed in the first region R1 (silicon nitride) through Step S25 in FIG. 12 (see Steps S26 in FIG. 12, FIG. 8, and FIG. 13). Here, UV is an electromagnetic wave having a wavelength of about 1 to 380 nm, which is shorter than visible light, and is longer than X-rays. The embodiment of emitting UV is not particularly limited, but a light source such as a UV lamp, a UV irradiator, and the like can be used.

When UV is emitted to the wafer W surface in Step S26 of FIG. 12, the polyurea formed in the first region R1 (silicon nitride) is crosslinked (see Step S26 in FIG. 12; and FIG. 13). That is, a wafer W with a cross-linked polyurea (hereinafter referred to as crosslinked polyurea or crosslinked polyurea) formed in the first region R1 (silicon nitride) is obtained (see FIGS. 13 and 14). Here, crosslinked polyurea shows one in which molecules within the polyurea are linked by chemical bonds. In the reaction formula shown in FIG. 14, Si is silicon on silicon nitride, and R is any chemical structure.

Such crosslinked polyurea can form a rigid film as a film selectively formed in the first region R1. In addition, because the crosslinked polyurea has higher heat resistance, chemical resistance, mechanical strength, and the like than those of the crosslinked polyurea, for example, by supplying an etching gas to the surface of the wear on which the crosslinked polyurea is formed in the first region R1, the silicon nitride in the first region R1 is strongly protected, and only the silicon oxide in the second region R2 is etched with high accuracy (see Step S27 in FIG. 12).

<Board Processing System>

The substrate processing system according to the present disclosure includes: a processing chamber in which a vacuum atmosphere is formed; a stage on which a substrate is placed; an energy source for supplying energy to the substrate surface; a first supply section for supplying a film deposition material to the substrate surface; and a controller, wherein the control section performs a process including: a) providing a substrate having a first region and a second region on a surface; b) supplying to the substrate surface a film deposition material that forms a first chemical bond in a first region and forms a second chemical bond having a lower bond energy than the first chemical bond in a second region; and c) selectively forming a film in the first region by supplying a bond energy lower than the first chemical bond energy to the substrate surface by the energy source.

Figure 15:
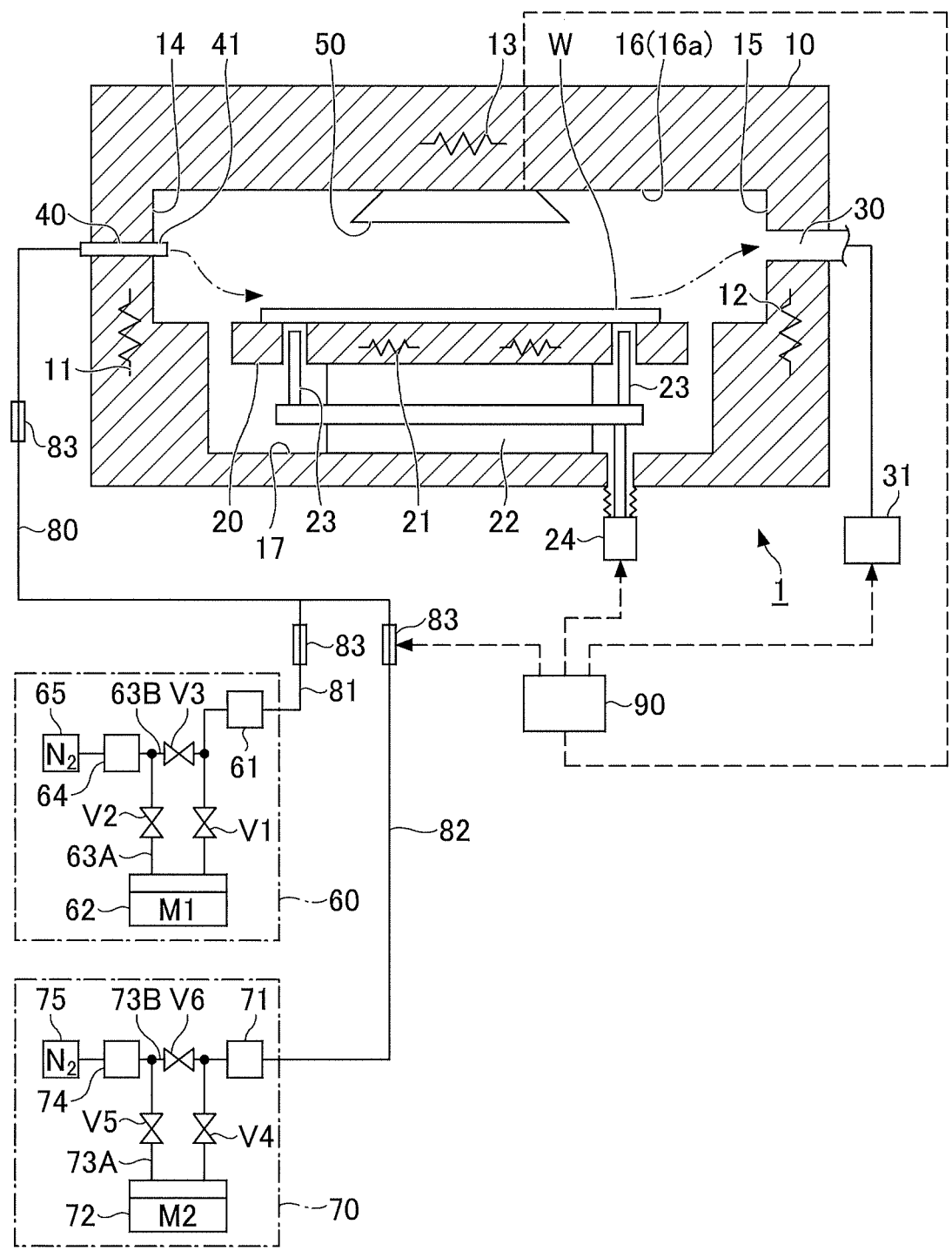
FIG. 15 is a cross-sectional view of a substrate processing apparatus that is an example of a substrate processing system according to the present disclosure.

FIG. 15 is a cross-sectional view of a substrate processing apparatus 1 that is an example of a substrate processing system according to the present disclosure. The substrate processing apparatus 1 includes a chamber 10, a stage 20, an exhaust port 30, a gas nozzle 40, a UV lamp 50, a first component supply mechanism 60, a second component supply mechanism 70, a gas supply line 80, and a computer 90.

The chamber 10 is constructed as a cylindrical, hermetically sealed vacuum vessel and forms a vacuum atmosphere therein. It should be noted that the shape of the vacuum vessel forming the chamber 10 is not limited to such a cylindrical shape, but may be other shapes, such as a rectangular shape inside. The chamber 10 is an example of a processing vessel that is a part of the substrate processing system of the present disclosure.

Sidewalls 14, 15 of the chamber 10 include sidewall heaters 11, 12. A ceiling wall 16 of the chamber 10 includes a ceiling heater 13. The ceiling surface 16a of the ceiling wall (ceiling) 16 of the chamber 10 is formed as a horizontal flat surface whose temperature is controlled by the ceiling heater 13.

The stage 20 is provided on the lower side of the chamber 10. A substrate (wafer W) is placed on the stage 20. The stage 20 is circularly formed in a plan view, and a wafer W is loaded on a horizontally formed surface (top surface). The shape of the stage 20 is not limited to such a circular shape, but may be another shape, such as a square shape in a plan view. The stage 20 is an example of a mounting section that forms part of the substrate processing system of the present disclosure.

In the substrate processing system of the present disclosure, an energy source for supplying energy to the substrate surface can be configured by a heater provided in a mounting section. Specifically, a stage heater 21 is embedded in the stage 20 (see FIG. 15). The stage heater 21 may heat the wafer W mounted on the stage 20. This provides energy to the wafer W surface.

The stage heater 21 provided on the stage 20 is an example of an energy source that is a part of the substrate processing system of the present disclosure. The stage heater 21 is also an example of a heater provided in a mounting section that constitutes the energy source.

The stage 20 is supported within the chamber 10 by columnar support 22 provided on a bottom surface 17 of the chamber 10. Vertical lift pins 23 are provided on the circumferential exterior of the columnar support 22. The lift pins 23 are each inserted into through-holes which are circumferentially spaced apart in the stage 20. In FIG. 15, two out of three lift pins 23 are illustrated. The lift pins 23 are controlled and moved up and down by a lifting mechanism 24. When the lifting pins 23 protrude from the surface of the stage 20, a wafer W is transferred between the conveying mechanism (not illustrated) and the stage 20.

The wafer W has a first region R1 and a second region R2 described above on the surface. Specifically, the wafer W has a first region R1 formed of silicon nitride (SiN) and a second region R2 formed of silicon oxide ($SiO_2$). Specifically, the surface of the first region R1 is composed of a Si—$NH_2$ group. The surface of the second region, R2, is composed of a Si—OH group (see FIG. 2). The substrate is not limited to the wafer W, but may be processed on a glass substrate for manufacturing a flat panel display.

An exhaust port 30 is provided in a side wall 15 of the chamber 10. The exhaust port 30 is connected to the exhaust mechanism 31. The exhaust mechanism 31 is configured by a vacuum pump, a valve, or the like through an exhaust pipe (not illustrated) to adjust the exhaust flow rate from the exhaust port 30. The pressure in the chamber 10 is adjusted by an adjustment of an exhaust flow rate or the like by the exhaust mechanism 31. The transfer port of the wafer W (not illustrated) is formed in a side wall of the chamber 10 (a position different from a position where the exhaust port 30 opens) in a manner that is open and closed.

The gas nozzle 40 is provided on the side wall 14 of the chamber 10 (different from the position where the exhaust port 30 and the transfer port, not illustrated, are formed). The gas nozzle 40 supplies the film deposition and process materials described above into the chamber 10. Specifically, the deposition material is included in the first component and the processing material is included in the second component, and each component (the first component and the second component) is supplied from the gas nozzle 40 into the chamber 10, respectively.

The film deposition material included in the first component is a film deposition material that forms a first chemical bond in the first region R1 and a second chemical bond in the second region R2 with a lower bond energy than the first chemical bond. In this disclosure, a nitrogen-containing carbonyl compound is used as the deposition material included in the first component. Specifically, diisocyanate is used. Incidentally, the deposition material included in the first component is not limited to the diisocyanate, but may be a material that can serve as the above-described deposition material.

The processing material included in the second component is a material that processes the terminal so that the first chemical bond is further formed at the terminal of the first chemical bond. In the present disclosure, as a second component, a processing material that terminates the first chemical bond with the N-terminal (e.g., an amino group) is used. Specifically, diamines are used. The second component is not limited to the diamine, but may be a material that can serve as the above-described processing material.

The gas nozzle 40 forms an orifice (a flow path through the sidewall 14) that supplies each component (first and second components). The gas nozzle 40 is provided at the side wall 14 of the chamber 10 opposite the exhaust port 30 as viewed from the center of the stage 20 (see FIG. 15).

The gas nozzle 40 is formed as a rod projecting from the side wall 14 of the chamber 10 toward the center of the chamber 10. The tip 41 of the gas nozzle 40 extends horizontally from the side wall 14 of the chamber 10. Each component (the first component and the second component) is discharged into the chamber 10 from a discharge hole (not illustrated) that opens at the tip 41 of the gas nozzle 40, flows in the direction of an arrow of the dashed single point line illustrated in FIG. 15, and is evacuated from the exhaust port 30.

It should be noted that the tip 41 of the gas nozzle 40 is not limited to this shape. The tip 41 of the gas nozzle 40 may be obliquely downwardly extending toward the mounted wafer W or obliquely upwardly extending toward the ceiling surface 16a of the chamber 10 in order to enhance the efficiency of deposition.

When the tip 41 of the gas nozzle 40 is shaped to extend obliquely upwardly toward the ceiling surface 16a of the chamber 10, each of the discharged components (first and second components) hits the ceiling surface 16a of the chamber 10 before being supplied to the wafer W. The area where the gas collides with the ceiling surface 16a is, for example, a position closer to the discharge holes of the gas nozzle 40 than the center of the stage 20, and is near the end of the wafer W when viewed in a plane.

In this way, when each component impinges on the ceiling surface 16a, the distance in which each component discharged from the gas nozzle 40 (the first component and the second component) reaches the wafer W becomes longer than the distance when each component is directly supplied from the gas nozzle 40 to the wafer W. As the travel distance of each component increases in the chamber 10, each component diffuses laterally and is supplied with high uniformity in the plane of the wafer W.

The gas nozzle 40 is not limited to being provided on the side wall 14 of the chamber 10 as described above, but may be provided on the ceiling wall 16 of the chamber 10. Also, the exhaust port 30 is not limited to being provided on the side wall 15 of the chamber 10 as described above, but may be provided on the bottom surface 17 of the chamber 10. The exhaust port 30 and the gas nozzle 40 are preferably provided in the side walls 15 and 14 of the chamber 10 as described above in order to form an air stream of the component so as to flow from one end to the other end of the surface of the wafer W and to achieve uniform and high film deposition on the wafer W.

The temperature of each component (the first component, the second component) discharged from the gas nozzle 40 is optional, but is preferably higher than the temperature in the chamber 10 until reaching the gas nozzle 40 in order to prevent it from liquefying in the flow path until reaching the gas nozzle 40. In this case, each component discharged into the chamber 10 is cooled down and supplied to the wafer W. When the temperature is lowered in such a way, the wafer W of each component becomes highly adsorptive, and the film deposition proceeds efficiently. The temperature in the chamber 10 is preferably higher than the temperature of the wafer W (or the temperature of the stage 20 where the stage heater 21 is buried), in order to further enhance the adsorptive properties of the wafer W.

A UV lamp 50 is provided on the ceiling wall (top plate) 16 of the chamber 10. The UV lamp 50 is provided in the ceiling wall (top plate) 16 at a position so as to face the stage 20 in the vertical direction, and irradiates the surface of the wafer W with UV light. The UV lamp 50 is an example of an ultraviolet irradiation portion that is part of the substrate processing system of the present disclosure.

It should be noted that the location of the UV lamp 50 is not limited to the chamber 10, but may be provided in a separate chamber provided outside the chamber 10, and the wafer W may be transported into the separate chamber for UV irradiation. Alternatively, a UV irradiator may be placed in or outside the chamber 10 to irradiate the wafer W with UV instead of the UV lamp 50.

A gas supply tube 80 is connected from the outside of the chamber 10 to the gas nozzle 40. The gas supply tube 80 has gas introduction tubes 81, 82 branching upstream. The gas introduction tubes 81, 82 are further connected to the first component supply mechanism 60, and the second component supply mechanism 70.

The first component supply mechanism 60 includes a flow adjusting section 61, a vaporizing section 62, gas supply lines 63A and 63B, a gas heating unit 64, an $N_2$ gas supply source 65, valves V1 to V3, and a downstream portion of the flow adjusting section 61 in the gas introduction tube 81 (see FIG. 15). The gas nozzle 40 and the first component supply mechanism 60 are examples of the first supply section that forms a part of the substrate processing system of the present disclosure.

With respect to the first component supply mechanism 60, the upstream side of the gas introduction tube 81 is connected to the vaporizing section 62 through the flow adjusting section 61 and the valve V1 in this order. In the vaporizing section 62, the above-described film deposition material (e.g., isocyanate) M1 is stored in a liquid state. The vaporizing section 62 includes a heater (not illustrated) for heating the film deposition material M1. One end of the gas supply tube 63A is connected to the vaporizing section 62, and the other end of the gas supply tube 63A is connected to the $N_2$ (nitrogen) gas supply source 65 through the valve V2 and the gas heating unit 64 in this order. In this configuration, the heated $N_2$ gas is supplied to the vaporizing section 62 to vaporize the film deposition material M1 in the vaporizing section 62, and a gas mixture of $N_2$ gas used for vaporizing and the film deposition material M1 gas may be introduced to the gas nozzle 40 as the first component.

Also, a gas supply tube 63B is formed on the downstream side of the gas heating unit 64 in the gas supply tube 63A. The gas supply tube 63B branches at the upstream side of valve V2, and the downstream end of gas supply tube 63B is connected via the valve V3 to the downstream side of the valve V1 of the vaporizing section 62 and the upstream side of flow adjusting section 61. With this arrangement, $N_2$ gas heated by the gas heating unit 64 is introduced into the gas nozzle 40 without passing the vaporizing section 62 when the first component is not supplied to the gas nozzle 40.

The second component supply mechanism 70 includes a flow adjusting section 71, a vaporizing section 72, gas supply tubes 73A and 73B, a gas heating unit 74, an $N_2$ gas supply source 75, valves V4 to V6, and a downstream portion of the flow adjusting section 71 in the gas introduction tube 82 (see FIG. 15). It should be noted that the gas nozzle 40 and the second component supply mechanism 70 are examples of the second supply section that is a part of the substrate processing system of the present disclosure.

With respect to the second component supply mechanism 70, the upstream side of the gas introduction tube 82 is connected to the vaporizing section 72 through the flow adjusting section 71 and the valve V4 in this order. Within the vaporizing section 72, the above-described treatment material (e.g., diamine) M2 is stored in a liquid state. The vaporizing section 72 includes a heater (not illustrated) for heating the process material M2. Further, one end of the gas supply tube 73A is connected to the vaporizing section 72, and the other end of the gas supply tube 73A is connected to the $N_2$ gas supply source 75 through the valve V5 and the gas heating unit 74 in this order. With such a configuration, heated $N_2$ gas is supplied to the vaporizing section 72 to vaporize the process material M2 in the vaporizing section 72, and a mixture of $N_2$ gas used for the vaporization and the process material M2, G2, may be introduced into the gas nozzle 40 as a second component.

Also, a gas supply tube 73B is formed on the downstream side of the gas heating unit 74 of the gas supply tube 73A. The gas supply tube 73B branches upstream of the valve V5, and the downstream end of gas supply tube 73B is connected via the valve V6 to the downstream side of the valve V4 of the vaporizing section 72 and the upstream side of flow adjusting section 71. With such a configuration, when the second component is not supplied to the gas nozzle 40, $N_2$ gas heated by the gas heating unit 74 is introduced into the gas nozzle 40 without the vaporizing unit 72.

For example, a pipe heater 83 is provided around each of the gas supply tube 80 and the gas introduction tubes 81 and 82 for heating the inside of the tubes, in order to prevent the deposition material M1 (isocyanate) in the first component and the processing material M2 (diamine) in the second component from being liquefied. The pipe heater 83 adjusts the temperature of each component discharged from the gas nozzle 40. In the present disclosure, for convenience of illustration, the pipe heater 83 is illustrated only in a portion of the pipe, but is provided throughout the pipe in order to prevent liquefaction. When the gas supplied from the gas nozzle 40 into the chamber 10 is simply described as $N_2$ gas, as described above, $N_2$ gas supplied without the vaporizing portions 62 and 72 is illustrated. Thus, the gas is distinguished from the $N_2$ gas contained in each component.

The gas introduction tubes 81 and 82 are not limited to the configuration in which the gas supply tube 80 connected to the gas nozzle 40 branches, but may be configured as a dedicated gas nozzle for independently supplying the first and second components to the chamber 10, respectively. This configuration prevents the second component from acting on or reacting with the first component and from depositing a film in the flow passage until the second component reaches the chamber 10.

The computer 90 is provided outside the chamber 10, the first component supply mechanism 60, and the second component supply mechanism 70 (see FIG. 15). The computer 90 outputs a control signal to each section of the substrate processing apparatus 1 by executing the program and controls the operation of each section. Specifically, the computer 90 controls the execution of each process such as a temperature adjustment in the chamber 10, a temperature adjustment of the stage 20, a transfer of the wafer W between the conveying mechanism and the stage 20, supply of a first component including the deposition material M1, supply of a second component including the processing material M2, and irradiation of the UV.

In addition, the computer 90 performs control other than the above-described control. Specifically, operations such as the exhaust flow rate by the exhaust mechanism 31, the flow rate of each gas supplied to the chamber 10 by the flow adjusting sections 61 and 71, the $N_2$ gas supply from the $N_2$ gas supply sources 65 and 75, the supply of power to each heater, and lifting of the lifting pins 23 by the lifting mechanism 24 are controlled by control signals output from the computer 90.

The computer 90 includes a program, a memory, and a CPU. The program incorporates instructions (each step) to proceed with processing for wafer W, which will be described later. The program may be stored on a computer storage medium, such as a compact disk, a hard disk, a magneto-optical disk, a DVD, or the like, and may be installed on the computer 90. The computer 90 is an example of a control unit that is a part of a substrate processing system according to the present disclosure.

Figure 16:
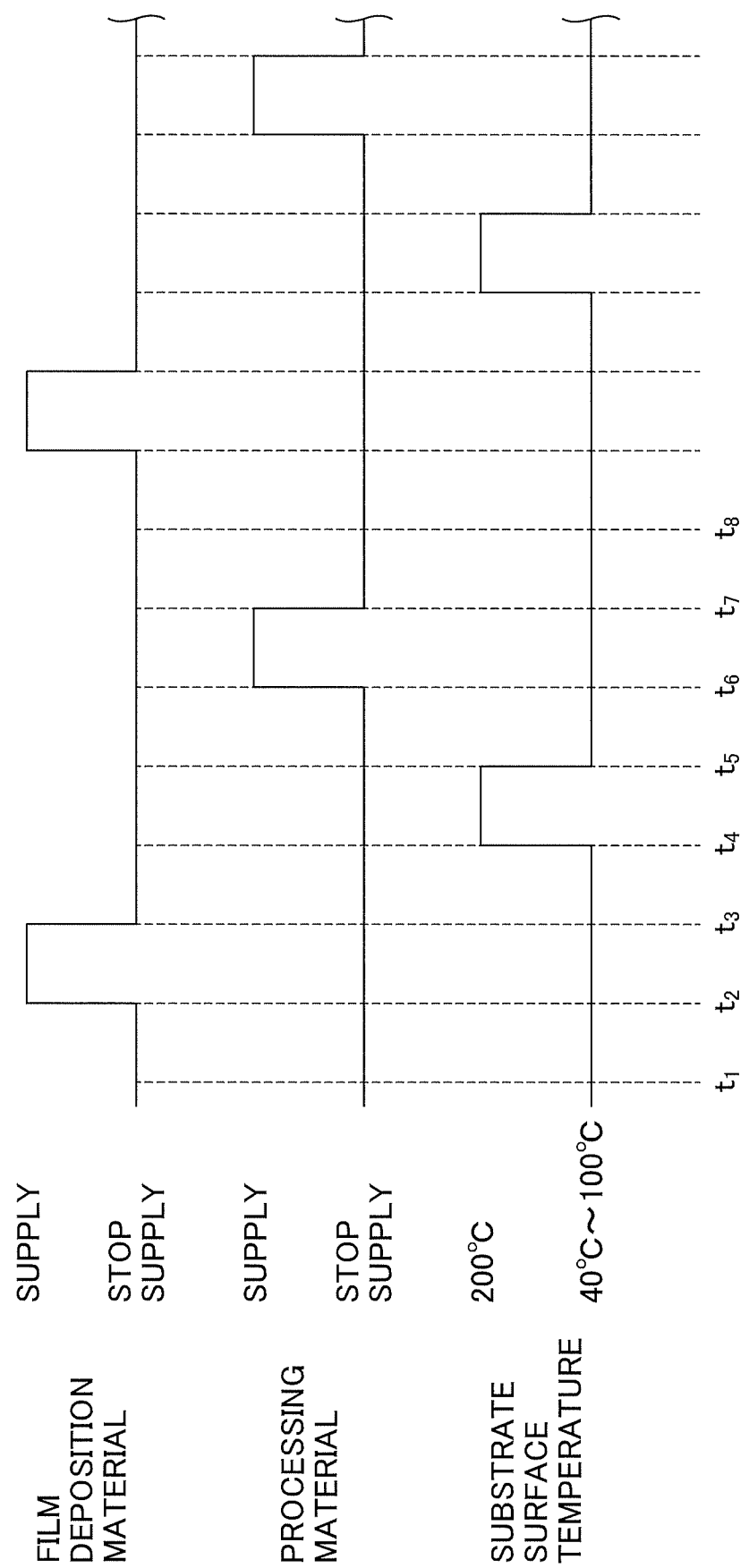
FIG. 16 is a diagram illustrating a timing chart for each component supply and temperature adjustment in an example of a substrate processing system.

Hereinafter, the process performed on the wafer W using the substrate processing device 1 will be described with reference to FIG. 16. FIG. 16 is a diagram illustrating a timing chart for each component supply and temperature adjustment in an example of a substrate processing system. In FIG. 16, only the supply of the first component and the second component is shown, and the supply of only $N_2$ gas (purge gas) is omitted.

In the substrate processing apparatus 1, the following processing is performed under the control of the computer 90. First, the wafer W is carried into the chamber 10 by a conveying mechanism (not illustrated) and passed to the stage 20 via lifting pins 23. It should be noted that the process of conveying the wafer W into the chamber 10 is an example of the process of providing a substrate according to the present disclosure.

Then, each heater (a sidewall heater 12, a ceiling heater 13, and a stage heater 21) adjusts the temperature of the stage 20 to about 40° C. to 100° C. (see FIG. 16, time t1). The chamber 10 is also adjusted to a vacuum atmosphere of predetermined pressure. Thus, the temperature of the stage 20 can be adjusted to a temperature (about 40° C. to 100° C.) at which a first chemical bond (urea bond) is formed in the first region (silicon nitride) and a second chemical bond (urethane bond) is formed in the second region (silicon oxide) before a first component containing diisocyanate is supplied to the chamber 10 from the first component supply mechanism 60. Further, by adjusting the temperature of the stage 20 to a range of about 40° C. to about 100° C., the first component containing the diisocyanate is deposited or adsorbed on the first region (silicon nitride) and the second region (silicon oxide), and impurities such as dirt and dust deposited or adsorbed on the wafer W are removed.

The first component gas including diisocyanate is supplied to the gas nozzle 40 from the first component supply mechanism 60, and the second component supply mechanism 70 supplies $N_2$ gas to the gas nozzle 40. The gas is mixed and discharged from the gas nozzle 40 into the chamber 10 at about 100° C. (see FIG. 16, time t2). The mixed gas (hereinafter referred to as a mixed gas G1) contains the first component gas and $N_2$ gas, but does not contain the second component gas.

The mixed gas G1 is maintained at about 100° C. in the chamber 10 and is supplied to the wafer W through the chamber 10. The mixed gas G1 is further cooled on the wafer W to about 80° C., and the first component in the mixed gas G1 is supplied to the wafer W. The temperature of the stage 20 is adjusted by each heater (sidewall heater 12, ceiling heater 13, stage heater 21).

As a result, when the mixed gas G1 is supplied to the chamber 10 while the stage 20 is adjusted to the range of about 40° C. to about 100° C., a first chemical bond (urea bond) is formed on the first region (silicon nitride) of the wafer W, and a second chemical bond (urethane bond) is formed on the second region (silicon oxide) (see FIG. 3).

The process of supplying the first component to the wafer W is an example of the process of supplying the film deposition material to the substrate surface by the first supply section that forms a part of the substrate processing system according to the present disclosure.

After the first component containing the diisocyanate is supplied to the wafer W for a certain period of time, the supply of the first component is stopped by the first component supply mechanism 60 (see FIG. 16, time t3). Subsequently, $N_2$ gas is supplied instead of the first component from the first component supply mechanism 60, and only $N_2$ gas is discharged from the gas nozzle 40 (time t3). The $N_2$ gas becomes a purge gas, and purges the unreacted first component in the chamber 10.

In the substrate processing system of the present disclosure, the controller adjusts the temperature of the mounting section to a temperature below the temperature at which the first chemical bond is broken and above the temperature at which the second chemical bond is broken by the heater. Specifically, after the supply of the first component gas is stopped, the temperature of the stage 20 is adjusted to about 200° C. to heat the wafer W (baking process) (see FIG. 16, time t4).

The heating period of time in the baking process is not particularly limited, but may be 5 seconds or more and 3 minutes or less, and may be 10 seconds or more and 60 seconds or less. Such a baking process is performed under humidity-controlled conditions. Each heater (the sidewall heater 12, the ceiling heater 13, the stage heater 21) can function as a heating unit that heats the wafer W and performs the baking process.

Thus, after the first component supply mechanism 60 supplies the first component containing the diisocyanate to the chamber 10, the temperature of the stage 20 can be adjusted to be below the temperature at which the first chemical bond (urea bond) is broken and above the temperature at which the second chemical bond (urethane bond) is broken (about 200° C.).

Specifically, in the wafer W in the chamber 10, the first chemical bond (urea bond) is not decomposed on the first region (silicon nitride) and only the second chemical bond (urethane bond) is decomposed on the second region (silicon oxide) (see FIG. 4). The unreacted isocyanate supplied to the wafer W surface is also removed.

Incidentally, the step of heating (baking) the wafer W by adjusting the temperature of the stage 20 to about 200° C. is an example of the step of supplying energy to the substrate surface by an energy source that is a part of the substrate processing system according to the present disclosure. Further, adjusting the temperature of the stage 20 to about 200° C. is an example of adjusting the temperature of the stage 20 below the temperature at which the first chemical bond is broken by a heater and above the temperature at which the second chemical bond is broken in the substrate processing system of the present disclosure.

According to the substrate processing system according to the present disclosure, a film deposition material that reacts with both the first region R1 and the second region R2 can be selected. In other words, the film deposition material is not limited to the film deposition material that reacts only to the portion where the film is deposited on the substrate surface (first region R1). Therefore, according to the substrate processing system of the present disclosure, a selective film deposition process can be easily performed.

In addition, while the conventional selective film deposition process mainly involves physical adsorption, the substrate processing system in accordance with the present disclosure performs a selective film deposition process mainly involving chemical adsorption. Therefore, according to the present disclosure, it is possible to provide a novel film coating process method.

In the substrate processing system of the present disclosure, as described above, by adjusting the temperature of the substrate surface to a temperature lower than the temperature at which the first chemical bond is cleaved and higher than the temperature at which the second chemical bond is cleaved, the film deposition material is not limited to the film deposition material that reacts only to the portion on which the film is to be deposited. Therefore, according to the substrate processing system of the present disclosure, a selective film deposition process can be performed more easily.

Further, in the substrate processing system according to the present disclosure, because the first chemical bond formed in the first region R1 of the substrate surface remains, by forming the first region R1 of silicon nitride, and forming the second region R2 of silicon oxide, the silicon nitride of the first region R1 can be formed as a base of the film deposition process. Incidentally, in the conventional selective film deposition process, the base of the film deposition process is mainly comprised of a hydroxyl group (OH group) of silicon oxide, but in the substrate processing system of the present disclosure, as described above, because the amino group ($NH_2$ group) of silicon nitride is mainly used, the bond strength of the base can be increased.

Further, in the substrate processing system of the present disclosure, by configuring the first chemical bond with the urea bond and the second chemical bond with the urethane bond, it is easy to select a film deposition material that forms the first chemical bond in the first region R1 and the second chemical bond in the second region R2 with the lower bond energy than the first chemical bond. Further, as the energy supplied to the substrate surface, it is easier to control the energy lower than the bond energy of the first chemical bond and higher than the bond energy of the second chemical bond.

Furthermore, in the substrate processing system of the present disclosure, by using a nitrogen-containing carbonyl compound (isocyanate) as the film deposition material, it is easier to form a first chemical bond in the first region R1 and a second chemical bond in the second region R2, which has a lower bond energy than that of the first chemical bond. Also, it is easier to control energy below the bond energy of the first chemical bond and above the bond energy of the second chemical bond.

The substrate processing system of the present disclosure further comprises a second supply section for supplying a processing material to the substrate surface. The control unit further causes the second supply section, d) after c), to perform the step of supplying the processing material for processing the terminal so that the first chemical bond is further formed at the terminal of the first chemical bond.

Specifically, the temperature of the stage 20 is maintained at about 200° C. for a certain period of time, and the temperature of the stage 20 is cooled to a range of about 40° C. to 100° C. (see FIG. 16, time t5). This adjusts the temperature of the stage 20 to the temperature at which the second component containing diamine is processed so that the first chemical bond (urea bond) is further formed at the terminal of the first chemical bond (urea bond) before the second component containing the diamine is supplied into the chamber 10 from the second component supply mechanism 70.

When the stage 20 is cooled, the heating of each heater (the side wall heater 12, the ceiling heater 13, and the stage heater 21) is stopped. A cooling device (not illustrated) may be also provided in the chamber 10 and/or the stage 20, and further cools the wafer W. Additionally, the cooling device may be provided in another chamber other than the chamber 10. Additionally, a cooling device may be provided in another chamber provided outside the chamber 10, and may cool the wafer W while carrying the wafer W into the other chamber.

Thereafter, $N_2$ gas from the first component supply mechanism 60 and the second component containing diamine from the second component supply mechanism 70 are each supplied to the gas nozzle 40 and discharged from the gas nozzle 40 into the chamber 10 in a state in which these gases are mixed and become 100° C. (see FIG. 16, time t6). The mixed gas (hereinafter referred to as a mixed gas G2) contains the second component gas and $N_2$ gas, but does not contain the first component gas.

The mixed gas G2 is also maintained at about 100° C. on the stage 20 and is circulated through the chamber 10 to the wafer W, similar to the mixed gas G1 containing the first component supplied into the chamber 10 from time t1 to time t2, and is further cooled to about 80° C. on the wafer W surface. Then, a second component in the mixed gas G2 is supplied to the wafer W.

Figure 10:
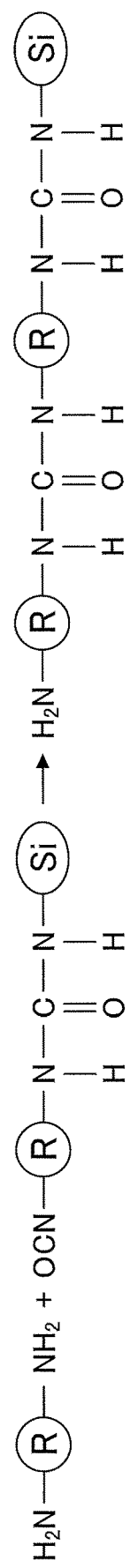
FIG. 10 is a diagram illustrating a reaction in which a terminal of a first chemical bond (urea bond) is treated with a processing material (diamine)
Figure 11:
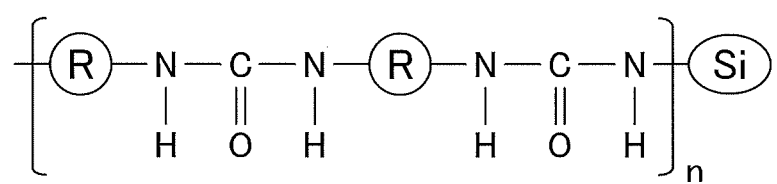
FIG. 11 is a diagram illustrating a chemical structure of polyurea.

The second component supplied to the wafer W acts on the first chemical bond (urea bond) already formed in the first region R1 of the wafer W, and forms an N-terminal (amino group) at the terminal of the first chemical bond (urea bond) (see FIGS. 8 and 10). Incidentally, the step of forming the N-terminal (amino group) at the terminal of the first chemical bond (urea bond) is an example of the step of supplying a processing material in the substrate processing system according to the present disclosure.

After the second component containing the diamine is supplied to the wafer W for a certain period of time, the second component supply is stopped by the second component supply mechanism 70 (see FIG. 16, time t7). Subsequently, $N_2$ gas is supplied instead of the second component from the second component supply mechanism 70, and only $N_2$ gas is discharged from the gas nozzle 40 (time t8). $N_2$ gas becomes a purge gas, and purges the unreacted second component in the chamber 10.

In the above-described series of processes, the temperature of the stage 20 is adjusted to a range of about 40° C. to 100° C. (time t1); the first component is supplied into the chamber 10 (time t2 to t3); the temperature of the stage 20 is adjusted to about 200° C. (time t4 to t5); the second component is supplied into the chamber 10 (time t6 to t7); and the temperature of the stage 20 is adjusted again to a range of about 40° C. to 100° C. (time t8).

When this sequence of processes is defined as one cycle, the cycles from time t1 to time t8 are repeated, and a film (polyurea film) containing the first chemical bond (urea bond) is formed on the first region R1 (silicon nitride). When a predetermined number of cycles is performed, the discharge of the gas from the gas nozzle 40 is stopped. Incidentally, by increasing the number of cycles, the thickness of the polyurea can be increased.

According to the substrate processing system of the present disclosure, a base for selectively depositing a polyurea film can be formed in the first region R1 (silicon nitride) of the wafer W surface. In addition, the polyurea film deposited in the first region R1 (silicon nitride) of the wafer W surface can be used as a protective film for etching, which is selectively deposited on the substrate surface in a manufacturing process of a semiconductor device and the like. Furthermore, the use of diamine as the processing material facilitates formation of a base for selectively depositing the polyurea film on the first region R1 (silicon nitride) of the wafer W surface.

The substrate processing system according to the present disclosure includes an ultraviolet irradiating section for irradiating the substrate surface with ultraviolet light, and e) after the step of d), the control unit further causes the ultraviolet irradiating section to perform the step of irradiating the substrate surface with ultraviolet light.

Specifically, a second component containing diamine is supplied into the chamber 10 by the second component supply mechanism 70, and after the above-described cycles have been performed a predetermined number of times, UV is emitted to the wafer W surface. Specifically, under the control of the computer 90, UV is emitted from the UV lamp 50 to the wafer W surface, and the polyurea film formed in the first region R1 (silicon nitride) is crosslinked (see Step S26 in FIG. 12 and FIG. 13). That is, a wafer W with crosslinked polyurea formed in the first region R1 (silicon nitride) is obtained (see FIGS. 13 and 14).

After formation of the crosslinked polyurea by UV irradiation, the above-described cycle (see FIG. 16, times t1 to t8) may be performed again. After the UV irradiation, the polyurea formed by the above-described cycle (see FIG. 16, t1 to t8) may be further irradiated with UV.

The resulting crosslinked polyurea (crosslinked polyurea) can form a rigid film as a film selectively formed in the first region R1. In addition, since the crosslinked polyurea has higher heat resistance, chemical resistance, mechanical strength, and the like than the crosslinked polyurea, for example, by supplying an etching gas to the surface of the wafer on which the crosslinked polyurea is formed in the first region R1, silicon nitride in the first region R1 is strongly protected, and only silicon oxide in the second region R2 is etched with high accuracy (see Step S27 of FIG. 12).

Figure 17:
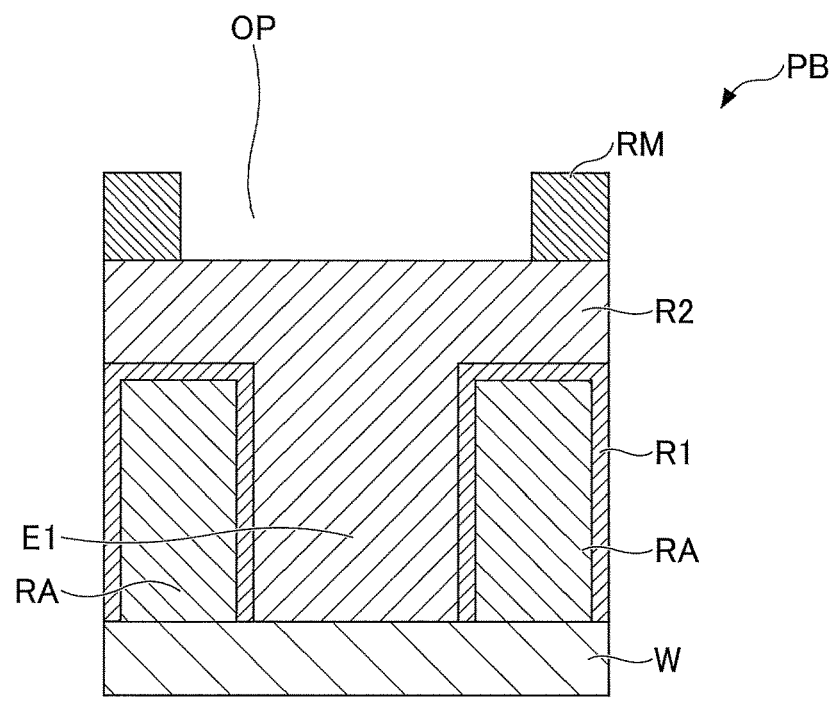
FIG. 17 is a cross-sectional view of a substrate etched according to an example of a substrate processing system.

FIGS. 17 to 23 illustrate an example of a process performed using a substrate processing system (substrate processing apparatus 1) in accordance with the present disclosure. In FIG. 17, a substrate (to be processed PB) etched by a substrate processing system in accordance with the present disclosure is prepared. Specifically, as illustrated in FIG. 17, a substrate to be processed PB having a wafer W, a raised region RA, a first region R1, a second region R2, and a resist mask RM is prepared.

The wafer W is formed of silicon and forms the base portion of the substrate to be processed PB. The raised region RA may be formed of silicon and be raised from the wafer W, and for example, may form a gate region.

The first region R1 is formed of silicon nitride ($Si_3N_4$) and is provided on the surfaces of the wafer W and the raised region RA. The first region R1 extends so as to form a recess E1 as illustrated in FIG. 17. In one example illustrated in FIG. 17, the depth of the recess E1 is about 150 nm and the width of the recess E1 is about 20 nm.

The second region R2 is composed of silicon oxide ($SiO_2$) and is provided on the wafer W and the first region R1. Specifically, the second region R2 is provided so as to fill the recess E1 formed by the first region R1 and to cover a portion of the first region R1. The second region R2 may, for example, form an interlayer insulating film.

The resist mask RM is formed on the second region R2 and has an opening OP having a width that is wider than the width of the recess E1 formed by the first region R1 and the wafer W. The width of the opening OP of the resist mask RM is, for example, 60 nm. Such a pattern of resist mask RM is formed by photolithographic techniques.

Figure 18:
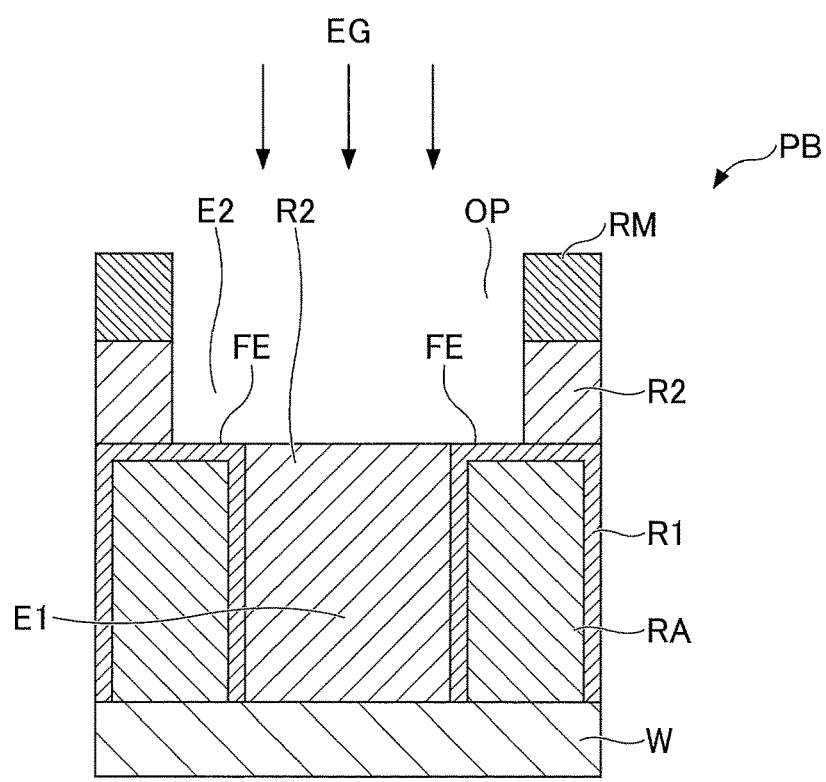
FIG. 18 is a cross-sectional view of a partially etched substrate in FIG. 17.

In FIG. 18, etching of the substrate to be processed PB in FIG. 17 with a processing gas (an etching gas) EG is performed. The process gas EG is not particularly limited, but may be a commonly used etching gas for $SiO_2$, such as a fluorocarbon gas (a mixed gas of $C_4F_6/Ar/O_2$). Etching is performed until a portion of the second region R2 is etched by anisotropic etching and a portion of the surface FE of the first region R1 is exposed. Accordingly, in the substrate to be processed PB, a recess E2 is formed by a portion of the first region R1 and a portion of the second region R2 (see FIG. 18).

Figure 19:
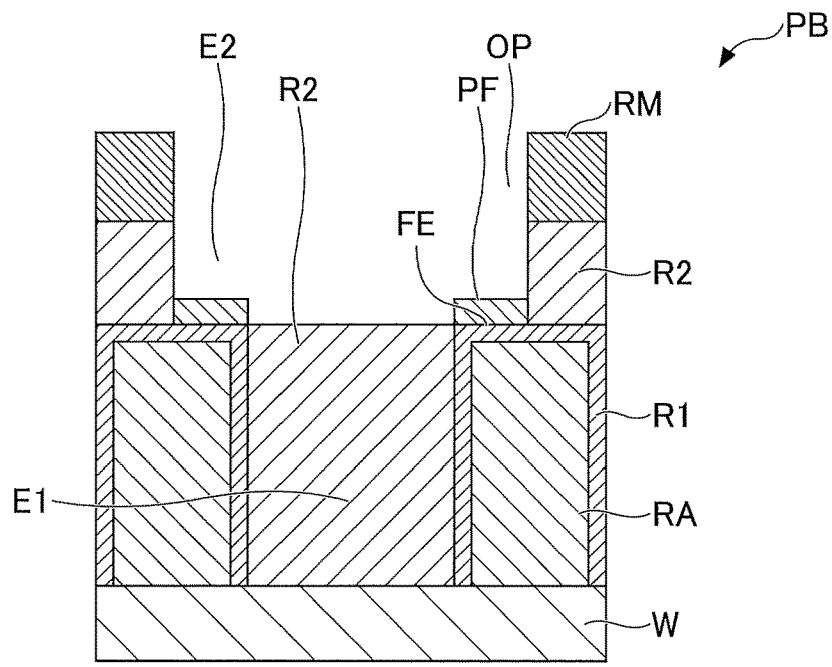
FIG. 19 is a cross-sectional view of a substrate on which a protective film is formed in an exposed portion.

In FIG. 19, in the substrate to be processed PB of FIG. 18, a polymer film PF is formed on the surface FE of the exposed first region R1. Specifically, the following operations (1) to (6) are performed.

(1) The substrate to be processed PB is heated to a range of about 40° C. to 100° C.
(2) The above-described film deposition material M1 (diisocyanate) is supplied to the substrate to be processed PB, thereby forming a first chemical bond (urea bond) in the first region R1 and a second chemical bond (urethane bond) in the second region R2.
(3) The substrate to be processed PB is heated to about 200° C., and only the second chemical bond in the second region R2 is decomposed, leaving the first chemical bond that does not decompose in the first region R1.
(4) The above-described processing material M2 (diamine) is supplied to the substrate to be processed PB to form an N-terminal (amino group) at the terminal of the first chemical bond (urea bond) formed in the first region R1.
(5) The above Steps (1) to (4) are repeated to form a polyurea film.
(6) The polyurea film is irradiated with UV to crosslink the polyurea film.

As a result, the film of the crosslinked polyurea (hereinafter referred to as the polymer film) PF is formed (film deposition) on the surface of the first region R1 on the substrate to be processed PB (see FIG. 19).

Figure 20:
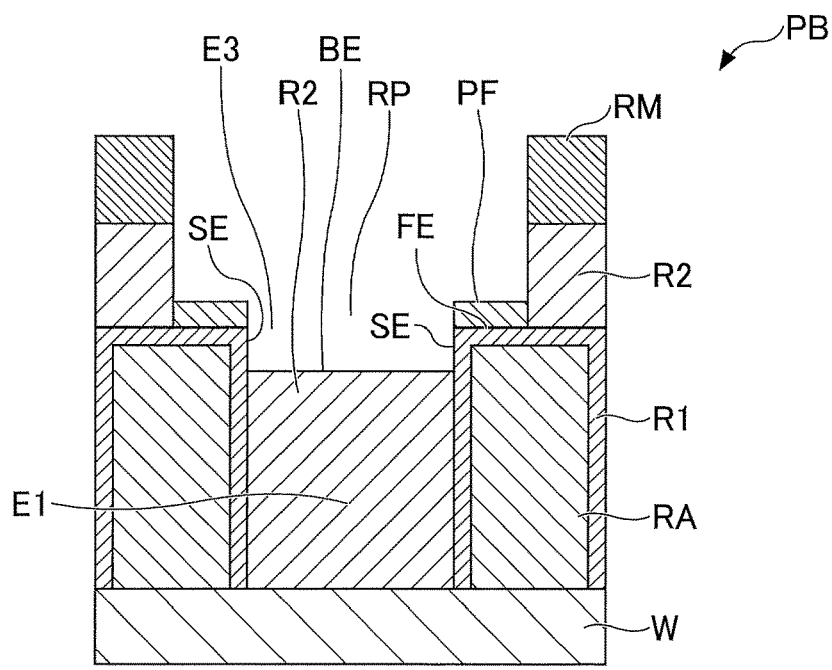
FIG. 20 is a cross-sectional view of a further partially etched substrate in FIG. 19.

In FIG. 20, further etching is performed with the processing gas described above in the substrate to be processed PB of FIG. 19. This exposes a portion of the side of the first region R1. In the substrate to be processed PB, the bottom BE of the recess E3 is formed by the surface of the exposed surface of the first region R1 and the surface of the second region R2. At this time, in the substrate to be processed PB, the second region R2 is etched while a portion of the surface FE of the first region R1 is protected by the film PF of the polymer. That is, the polymer film PF becomes a protective film for the first region R1 (see FIGS. 19 and 20).

Figure 21:
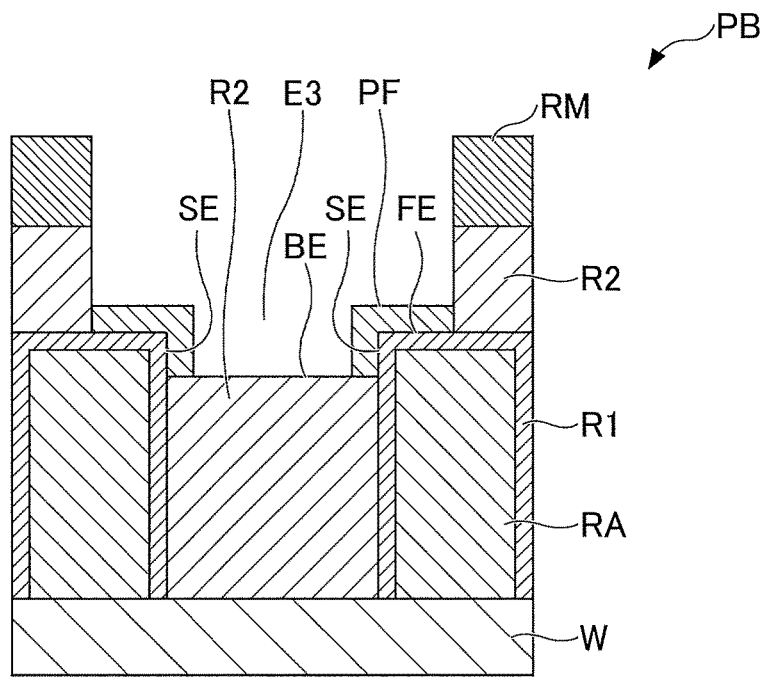
FIG. 21 is a cross-sectional view of a substrate on which a protective film is further formed in an exposed portion in FIG. 20.

In FIG. 21, in the substrate to be processed PB of FIG. 20, a polymer film PF is formed on a portion of the side surface SE of the exposed first region R1. Specifically, the above operations (1) to (6) are performed. As a result, the polymer film PF is formed (deposited) on the side part SE of exposed first region R1 (see FIG. 21).

Figure 22:
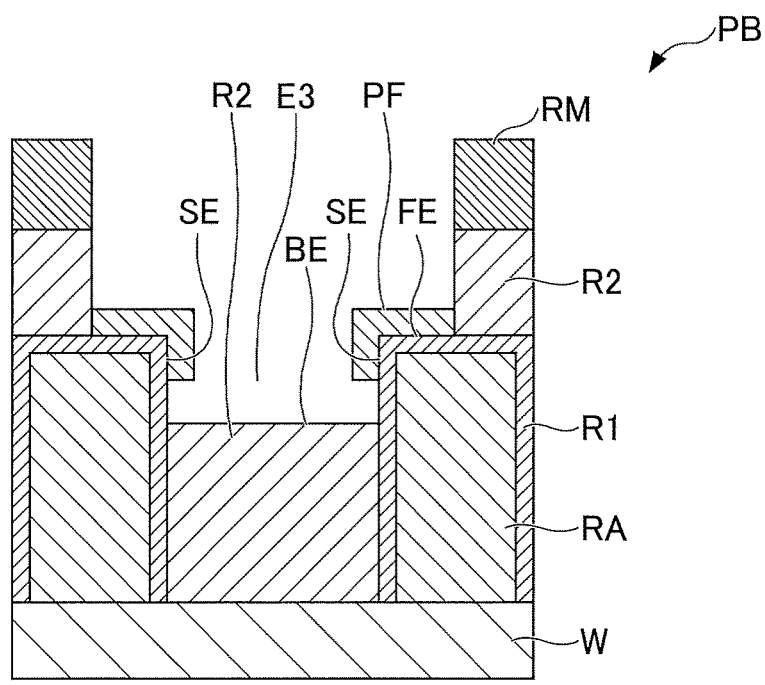
FIG. 22 is a cross-sectional view of a further partially etched substrate.

In FIG. 22, the substrate to be processed PB of FIG. 21 is further etched using the above-described processing gas. This further exposes a portion of the side surface of the first region R1. In the substrate to be processed PB, the bottom BE of the recess E3 formed by the side surface SE of the exposed first region R1 and the surface of the second region R2 is formed in a deeper position than the state of FIG. 21 (see FIG. 22). In this case, in the substrate to be processed PB, the second region R2 is etched while a portion of the surface FE of the first region R1 and a portion of the side surface SE are protected by the film PF of the polymer P. That is, the polymer film PF also becomes a protective film for a portion of the side surface SE of the first region R1 (see FIGS. 21 and 22).

Figure 23:
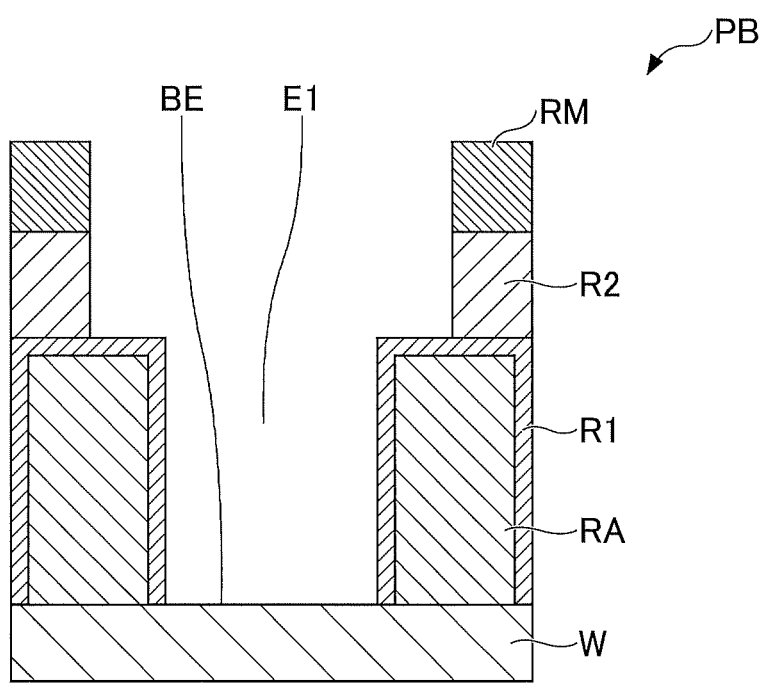
FIG. 23 is a cross-sectional view of a substrate on which a protective film is removed.

Then, as illustrated in FIG. 23, the above operations (1) to (6) are repeated until the bottom BE of the recess E1 of the substrate to be processed PB becomes a part of the surface of the wafer W (until a part of the surface of the wafer W is exposed). Specifically, the second region R2 is etched while a portion of the surface FE of the first region R1 and a portion of the side surface SE are protected by the film PF of the polymer P (see FIGS. 21 and 22), and the deposition and etching operation of the film PF of the polymer is completed when the second region R2, with which the recess E1 had been filled in FIG. 19, is removed. The recess E1 formed in the substrate to be processed PB may, for example, form a recess for embedding an interconnection.

The resist mask RM and the second region R2 immediately below the resist mask RM may remain till the state illustrated in FIG. 23. The remaining resist mask RM and the second region R2 can be then removed by an ashing process and the like.

The substrate processing system (substrate processing apparatus 1) may be constructed so that the above-described film deposition and etching process of the polymer film PF can be performed in the same processing chamber of the substrate processing system (substrate processing apparatus 1) according to the present disclosure. In addition, the deposition process and the etching process of the polymer film PF may be performed by providing different apparatus configurations or apparatus mechanisms in the same apparatus.

According to the substrate processing system of the present disclosure, because the polyurea formed on the wafer W includes urea bonds, and the polyurea film has a long conjugate system of double bonds, the polyurea film is resistant to oxidation treatment, sputtering, and the like as the above-described protective film.

Thus, as discussed above, according to the embodiments of the present disclosure, a selective film deposition process can be performed.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A method for processing a substrate, comprising:
a) providing a substrate having a first region and a second region on a substrate surface;
b) supplying a film deposition material to form a first chemical bond in the first region and a second chemical bond in the second region to the substrate surface, the second chemical bond having a second bond energy lower than a first bond energy of the first chemical bond; and
c) selectively forming a film in the first region by supplying an energy lower than the first bond energy of the first chemical bond and higher than the second bond energy of the second chemical bond, wherein the first chemical bond is urea bond, and
the second chemical bond is urethane bond.

2. The method as claimed in claim 1, wherein the step c) comprises supplying the energy by setting the substrate surface to a temperature lower than a first temperature at which the first chemical bond is broken and higher than a second temperature at which the second chemical bond is broken.

3. The method as claimed in claim 1, wherein
the first region is formed of silicon nitride, and
the second region is formed of silicon oxide.

4. The method as claimed in claim 1, wherein
the film deposition material is a nitrogen-containing carbonyl compound.

5. The method as claimed in claim 1, further comprising:
d) supplying a processing material to the substrate surface after the step c), the processing material processing a terminal of the first chemical bond such that another first chemical bond is further formed on the terminal of the first chemical bond.

6. The method as claimed in claim 1, further comprising:
f) selectively etching the second region with respect to the first region using the film.

7. A method for processing a substrate, comprising:
a) providing a substrate having a first region and a second region on a substrate surface;
b) supplying a film deposition material to form a first chemical bond in the first region and a second chemical bond in the second region to the substrate surface, the second chemical bond having a second bond energy lower than a first bond energy of the first chemical bond;
c) selectively forming a film in the first region by supplying an energy lower than the first bond energy of the first chemical bond and higher than the second bond energy of the second chemical bond; and
d) supplying a processing material to the substrate surface after the step c), the processing material processing a terminal of the first chemical bond such that another first chemical bond is further formed on the terminal of the first chemical bond, wherein
the processing material is diamine.

8. A method for processing a substrate, comprising:
a) providing a substrate having a first region and a second region on a substrate surface;
b) supplying a film deposition material to form a first chemical bond in the first region and a second chemical bond in the second region to the substrate surface, the second chemical bond having a second bond energy lower than a first bond energy of the first chemical bond;
c) selectively forming a film in the first region by supplying an energy lower than the first bond energy of the first chemical bond and higher than the second bond energy of the second chemical bond;
d) supplying a processing material to the substrate surface after the step c), the processing material processing a terminal of the first chemical bond such that another first chemical bond is further formed on the terminal of the first chemical bond; and
e) irradiating the substrate surface with ultraviolet light after the step d).

\* \* \* \* \*